United States Patent
Ma et al.

(10) Patent No.: US 7,054,384 B1
(45) Date of Patent: May 30, 2006

(54) POWER AMPLIFIER SHARING IN A WIRELESS COMMUNICATION SYSTEM WITH TRANSMIT DIVERSITY

(75) Inventors: Zhengxiang Ma, Summit, NJ (US); Paul Anthony Polakos, Marlboro, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 871 days.

(21) Appl. No.: 09/631,885

(22) Filed: Aug. 4, 2000

(51) Int. Cl.
  *H04L 27/04* (2006.01)
(52) U.S. Cl. ............... 375/299; 375/267; 375/297; 455/101
(58) Field of Classification Search ........... 375/299, 375/285, 267, 295, 296, 297; 455/101
  See application file for complete search history.

(56) References Cited

U.S. PATENT DOCUMENTS

| | | | |
|---|---|---|---|
| 5,646,631 A | 7/1997 | Arntz | 342/373 |
| 5,675,285 A | 10/1997 | Winters | 330/124 R |
| 6,377,632 B1 * | 4/2002 | Paulraj et al. | 375/299 |
| 6,539,209 B1 * | 3/2003 | Dajer et al. | 455/101 |
| 6,584,330 B1 * | 6/2003 | Ruuska | 455/574 |
| 6,724,828 B1 * | 4/2004 | Dabak | 375/267 |
| 6,754,872 B1 * | 6/2004 | Zhang et al. | 714/786 |
| 6,859,643 B1 * | 2/2005 | Ma et al. | 455/101 |

FOREIGN PATENT DOCUMENTS

| EP | 0 704 964 A2 | 9/1995 |
|---|---|---|
| EP | 1 018 808 A2 | 12/1999 |

OTHER PUBLICATIONS

European Search Report dated Jan. 4, 2002 for Application No. 01301204, Munich.

* cited by examiner

*Primary Examiner*—Temesghen Ghebretinsae

(57) ABSTRACT

A method and transmitter for amplifying at least first and second diversity-encoded signals, where each of the first and second diversity-encoded signals may represent information of a first signal to be transmitted using transmit diversity. Amplification of the first and second diversity-encoded signals may be shared between at least two amplifiers, and amplification for a second signal, to be amplified and transmitted without using transmit diversity, may be shared between the at least two amplifiers.

34 Claims, 13 Drawing Sheets

POWER AMPLIFIER SHARING IN A WIRELESS COMMUNICATION SYSTEM WITH TRANSMIT DIVERSITY

BACKGROUND OF THE INVENTION

1. Field of the Invention

This invention relates to efficient use of amplifier power capacity in, for example, a wireless communication system having transmit diversity.

2. Description of Related Art

In wireless communication systems a geographic area is divided into a plurality of spatially distinct areas called "cells." Each cell contains a base station that includes equipment to communicate with a mobile switching center (MSC). The MSC is connected to a local and/or long-distance transmission network, such as a public switched telephone network (PSTN). Each base station also includes radios, power amplifiers, and antennas that the base station uses to communicate with mobile terminals, each communication session with a particular mobile terminal being referred to as a "call."

As a mobile terminal moves, the strength of the signals received at the mobile terminal from a base station varies. This variation is due to a variety of factors, including the distance of the mobile terminal from the base station, the destructive interference due to so-called out of phase multipaths, and the presence of obstructions, such as buildings, in the path of the signal from the base station to the mobile terminal. This phenomenon is referred to as fading. One way to deal with fading is via a technique known as transmit diversity. Transmit diversity involves transmitting a signal over at least two spaced apart antennas. Where two antennas are used, the signal is processed using two distinct encoding sequences to produce two diversity-encoded signals, each of which is amplified in one of two power amplifiers and transmitted over one of the two antennas. Because the diversity-encoded signals are transmitted over spaced apart antennas, the fading of the two diversity-encoded signals will be different from each other. This allows the combined transmit power of the diversity-encoded signals to be reduced without reducing the quality of the signal received at the mobile terminal. Typically, a gain of 3 dB is realized when transmit diversity is used. This means that without affecting the quality of the communications, the combined transmit power of the two diversity-encoded signals (directed to one of the mobile terminals) can be about one-half the transmit power of a signal transmitted without transmit diversity. A reduction in transmit power allows an increase in the number of signals that can be transmitted simultaneously, thus increasing capacity. (The capacity of the wireless communication system is the number of calls that can be carried simultaneously by the wireless communication system.) This increase in capacity is obtained without increasing the total power amplifier power capacity, where a power amplifier's power capacity is the maximum output power level at which the power amplifier is designed to operate over an extended time period. Since there are two power amplifiers, one for each of the diversity-encoded signals, the total power amplifier power capacity is the same as that of the power amplifier used in a non-diversity system (a wireless communication system that does not use transmit diversity) when each power amplifier is one-half the power capacity of the power amplifier of the non-diversity system. Alternatively, the reduction in transmit power obtained by using transmit diversity allows the power capacity of each of the two power amplifiers to be reduced to about one-quarter the power capacity of the power amplifier of a non-diversity system with the same capacity.

To obtain the benefits of transmit diversity, the mobile terminal must be diversity-capable, meaning that it is designed to be able to process and combine the two diversity-encoded signals once they are received at the mobile terminal. If the mobile terminal is not diversity-capable, it will not be able to process and combine the diversity-encoded signals. Currently most mobile terminals are not diversity-capable. Therefore, it is advantageous for a base station to be able to communicate with diversity-capable mobile terminals as well as with those that are not. There are two cases that define what power capacity is needed of one of the base station's two amplifiers, with each defining what power capacity is needed of one of the base station's two power amplifiers. In the first case, the base station is at full load and communicating only with non-diversity-capable mobile terminals. In this case, all of the signals are amplified by one of the base station's power amplifiers, for example, a first power amplifier, and transmitted over one antenna. Therefore, the power capacity of the first power amplifier has to be large enough to amplify all of the signals while at least maintaining the same capacity as that of a system without transmit diversity. In the second case, the base station is at full load and communicating only with diversity-capable mobile terminals. In this case, each of the signals is encoded to produce two diversity-encoded signals, each of which is amplified in one of the two power amplifiers. Therefore, the second power amplifier can be smaller than the first power amplifier, since as explained above, the power of the signals transmitted using transmit diversity is smaller than the power of the signals transmitted without using it. However, the second power amplifier still has to be large enough to amplify one of the two diversity-encoded signals to each mobile terminal.

One of the problems with the base station described above is that at least one (and usually both) of the power amplifiers is underutilized most of the time. When all of the mobile terminals communicating with the base station are not diversity-capable, all of the signals transmitted from the base station to the mobile terminals are amplified by the first power amplifier, leaving the second power amplifier not utilized. When any of the mobile terminals communicating with the base station are diversity-capable, the signals to those mobile terminals are amplified by both power amplifiers. If the second power amplifier is smaller than the first power amplifier, then the first power amplifier is underutilized, thus, at least one of the two power amplifiers is always underutilized. If the second power amplifier is the same size as the first power amplifier, then the first power amplifier may not be underutilized, however, now the second power amplifier has a fairly large power capacity, and when all of the mobile terminals are not diversity-capable all of this power capacity is wasted. (Note that in this case even when some of the mobile terminals are diversity capable and some are not diversity capable, a fairly large amount of the power capacity of this power amplifier is wasted.) Because, the cost of the power amplifier is directly proportional to its power capacity, and because power amplifiers used in these types of applications are very expensive (typically 15% to 25% of the entire cost of the base station), the wasted power capacity in both of the above cases can be a significant expense.

Therefore, it is desirable to have a base station capable of communicating with diversity-capable mobile terminals as well those that that are not diversity-capable, where the base station's power amplifiers are more fully utilized.

SUMMARY OF THE INVENTION

The present invention solves the above problems by sharing amplifiers in a system designed to accommodate transmit diversity. The amplifiers are shared 1) to amplify a first and a second diversity-encoded signal, each of which represents the information of a first signal that is to be transmitted using transmit diversity, and 2) to amplify a second signal to be transmitted without using transmit diversity.

In an illustrative embodiment of the invention, the first and second diversity-encoded signals are used to form a first and a second composite signal. Each composite signal is amplified in a different one of two power amplifiers. Each amplified composite signal is then used to form an amplified first diversity-encoded signal and an amplified second diversity-encoded signal. Optionally, the amplified first and second diversity-encoded signals can be amplified and phase-shifted first and second diversity-encoded signals.

The first and second composite signals can also be formed using the second signal. Each composite signal is then amplified in a different one of the two power amplifiers and the two amplified composite signals are used to form an amplified second signal. In this case, the power of each composite signal is only one-half of the power of the second signal. This allows the power capacity of each of the two power amplifier to be one-half of the power capacity of a power amplifier of a non-diversity system with the same capacity. Therefore, both amplifiers are utilized when a signal is transmitted without transmit diversity, reducing any waste of power amplifier power capacity and its associated cost. Additionally, because the amplifiers are of equal size, when transmit diversity is used the power of the composite signal is half of the power of the sum of the first and second diversity-encoded signals, and the two amplifiers are also more fully utilized.

DETAILED DESCRIPTION

Figure 1:
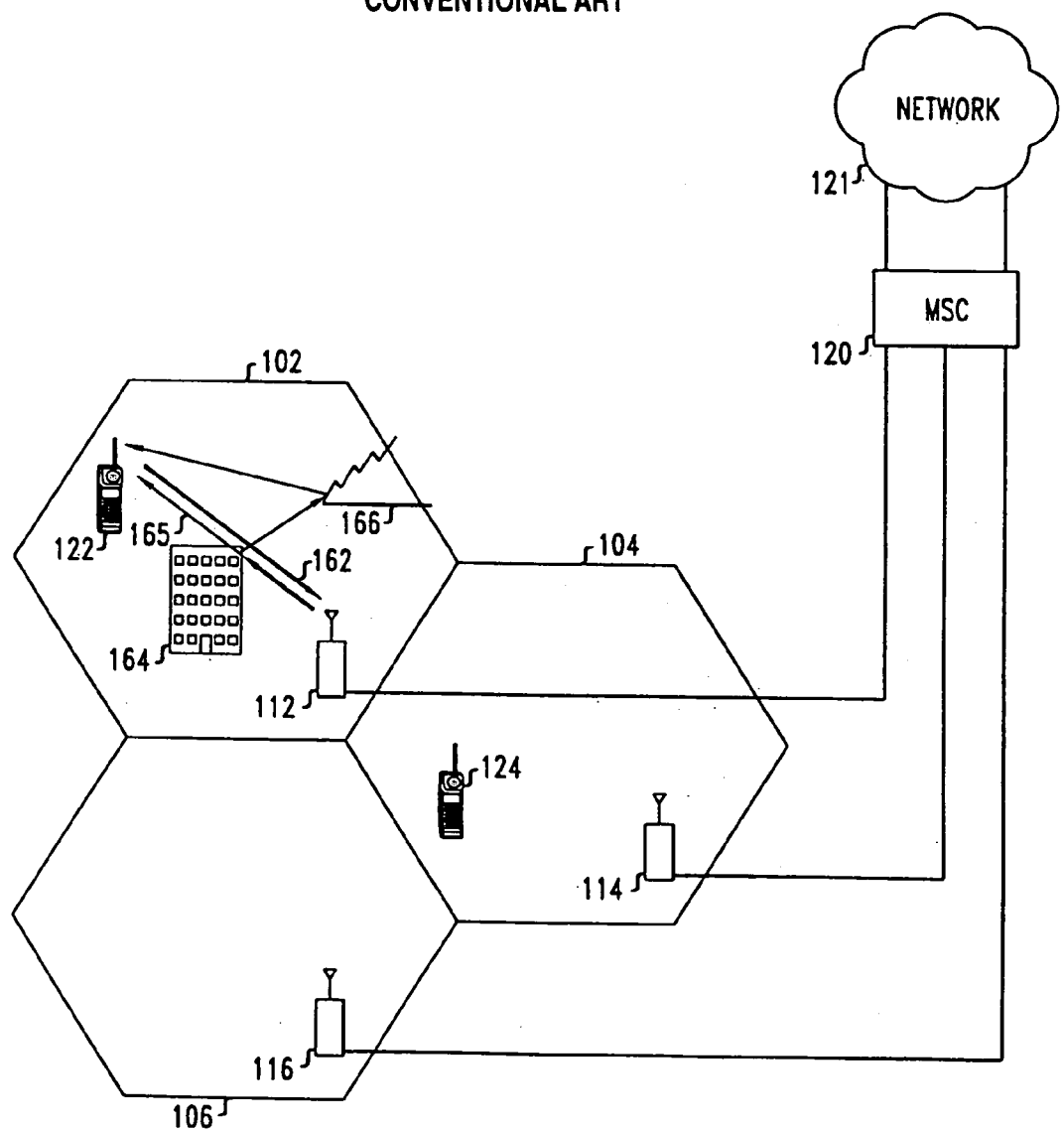
FIG. 1 is a portion of a conventional wireless communication system.

In conventional wireless communication system 100, shown in FIG. 1, a geographic area is divided into a plurality cells 102, 104, and 106. Each cell 102, 104, and 106 contains at least one base station 112, 114, and 116, respectively. Each base station 112, 114, and 116 includes equipment to communicate with mobile switching center (MSC) 120. MSC 120 is connected to local and/or long-distance transmission network 121, such as a public switched telephone network (PSTN). Each base station also includes equipment to communicate with mobile terminals, such as 122, 124. Each communication session with a particular mobile terminal is referred to as a "call."

Figure 2:
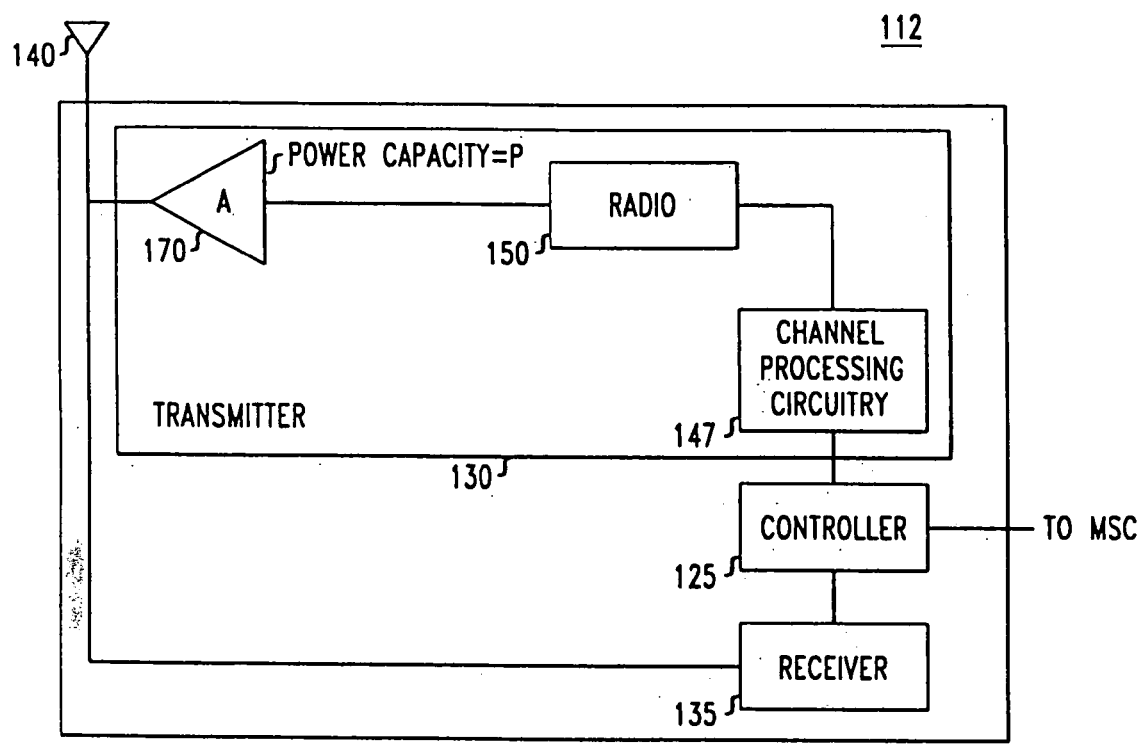
FIG. 2 is a portion of a base station of the wireless communication system shown in FIG. 1.

FIG. 2 shows base station 112 in more detail. Base station 112 includes controller 125 that is coupled to transmitter 130 and to receiver 135. Transmitter 130 and receiver 135 are coupled to antenna 140. Referring to FIGS. 1 and 2 the operation of base station 112 is now described. Digital signals are sent from MSC 120 to controller 125. These digital signals can be signals for controlling wireless communication system 100, or they can be signals that convey voice or data intended for mobile terminal 122. Controller 125 sends the digital signals to transmitter 130. Transmitter 130 includes channel processing circuitry 147 and radio 150. Channel processing circuitry 147 encodes each digital signal, and radio 150 modulates the encoded signals onto a radio frequency (RF) signal. The RF signal is then amplified in power amplifier 170 having a power capacity of P and a gain of A. (The power amplifier's power capacity is the maximum output power level at which the power amplifier is designed to operate over an extended time period.) The result of the amplification is signal 165, which is transmitted over antenna 140 to mobile terminal 122. Antenna 140 also receives signals 162 sent to base station 112 from mobile terminal 122. Antenna 140 sends these signals to receiver 135 that demodulates them into digital signals and sends them to controller 125, which sends them to MSC 120.

As mobile terminal 122 moves, the strength of the signal received at mobile terminal 122 varies due to fading, which can be caused by, for example, changes in the distance of mobile terminal 122 from base station 112, the destructive interference due to out of phase multipaths, and the presence of obstructions in the path of signal 165. For example, building 164 obstructs the path of signal 165. Signal 165 is greatly attenuated as it passes through building 164, therefore, the strength of the signal received at mobile terminal 122 may be very weak. Additionally, multipaths of signal 165 may also be received at mobile terminal 122. Multipaths of a signal are portions of the signal that travel to mobile terminal via paths other than the direct line of sight path between base station 112 and mobile terminal 122. For example, a multipath of signal 165 is produced when signal 165 hits building 164 and a portion of signal 165 is reflected off of building 164 and then off of mountain range 166 to eventually get to mobile terminal 122. When the multipath of signal 165 reaches mobile terminal 122, the multipath is significantly weaker than received signal would have been had building 164 not been in its way to mobile terminal 122. Additionally, the multipath of signal 165 can be out of phase with signal 165, in which case the multipath and the signal will destructively interfere—will produce a signal having a smaller power—when they combine at mobile terminal 122. The sum of the attenuated signal 165 received at mobile terminal 122 and the multipaths of signal 165 received at mobile terminal 122 can be significantly weaker than the received signal would have been had it not been for the out of phase multipath and the obstruction of building 164. Therefore, base station 112 has to transmit signal 165 at a much larger power for mobile terminal 122 to receive signal 165 at an acceptable power.

One way to deal with fading is via a technique known as transmit diversity. Transmit diversity involves being able to transmit multiple diversity encoded replicas of a signal over channels that have uncorrelated fading characteristics. The diversity-encoded replicas of the signal can be produced using diversity codes and encoding sequences as described below. Transmit diversity can be implemented using spatial diversity, i.e. transmitting the diversity encoded signals over spaced apart antennas, time diversity, i.e. transmitting the diversity encoded signals at a time interval from each other, polarization diversity, i.e. transmitting the diversity encoded signals over two antennas having different polarization, or any other form of diversity. For ease of reference the invention will be illustrated with spatial diversity, although any diversity technique can be used.

Figure 3:
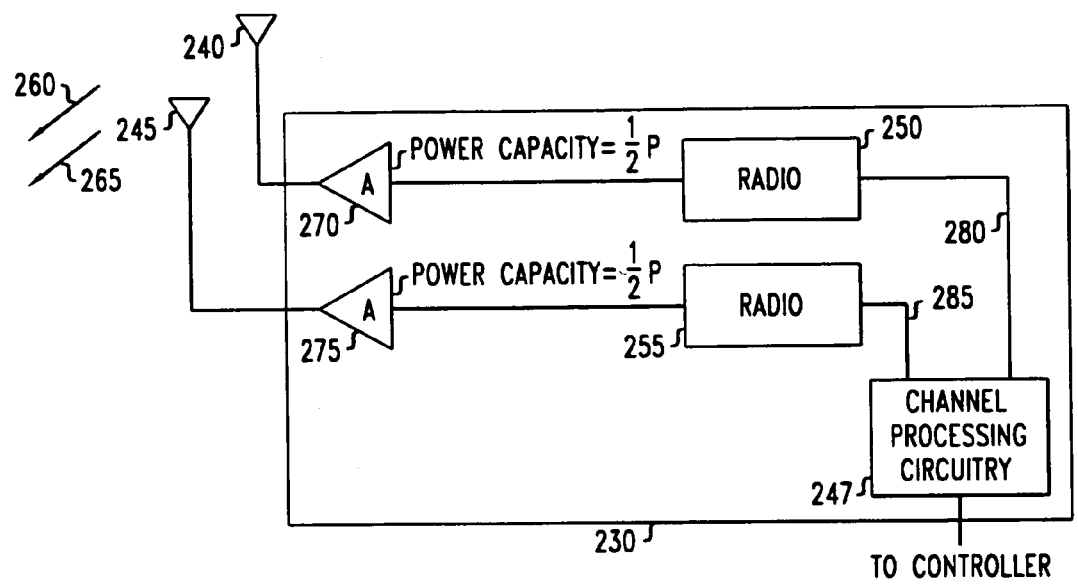
FIG. 3 shows two spaced apart antennas and a portion of a transmitter capable of transmitting signals using transmit diversity.
Figure 4:
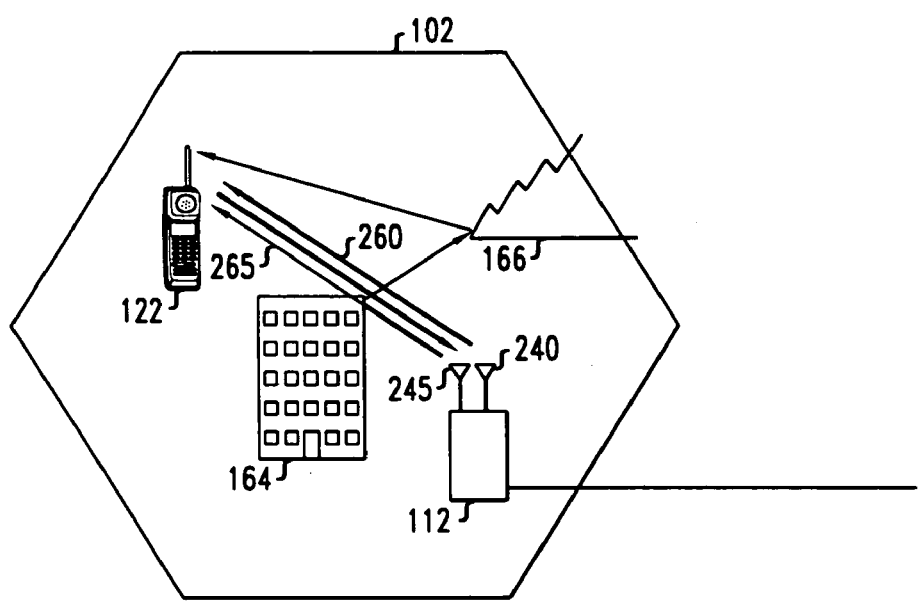
FIG. 4 is a cell of a wireless communication system that contains the base station with the transmitter of FIG. 3.

FIG. 3 shows transmitter 230 connected to two spaced apart antennas 240 and 245. Transmitter 230 and antennas 240 and 245 can replace transmitter 130 and antenna 140 in base station 112 to allow base station 112 to transmit signals using only transmit diversity. The digital signal is provided from the controller to channel processing circuitry 247 where the signal is replicated and each of the replicas is encoded using a distinct encoding sequence to produce a first and a second diversity-encoded signal. Each diversity-encoded signal is provided to a different one of two radios 250 and 255 where each diversity-encoded signal is modulated onto an RF signal. The first diversity-encoded signal is then amplified in power amplifier 270 and transmitted over antenna 240, and the second diversity-encoded signal is amplified in power amplifier 275 and transmitted over antenna 245. Because the diversity-encoded signals are transmitted over antennas that are spaced apart, the fading of the two diversity-encoded signals will be different from each other. For example, FIG. 4 shows base station 112 that uses transmitter 230 and antennas 240 and 245. As can be seen in FIG. 4, building 164 is in the path of signal 265 from antenna 245 to mobile terminal 122, but building 164 is not in the path of signal 260 from antenna 240 to mobile terminal 122.

The difference in the fading of the signals transmitted on the spaced apart antennas 240 and 245 allows the combined transmit power of the diversity-encoded signals to be reduced without reducing the quality of the signal received at mobile terminal 122. Typically, a gain of 3 dB is realized when transmit diversity is used. This means that without affecting the quality of the communications, the combined transmit power of the two diversity-encoded signals directed to mobile terminal 122 can be about one-half of a non-diversity transmit power, which is the transmit power of a signal transmitted without transmit diversity. This reduction in transmit power allows an increase in the number of signals that can be transmitted simultaneously, thus increasing capacity.

Because the combined transmit power of the two diversity-encoded signals directed to mobile terminal 122 is about one-half the non-diversity transmit power, the transmit power of each of the diversity-encoded signals can be about one-quarter the non-diversity transmit power. When all communications to the mobile terminals use transmit diversity, the combined power of all of the signals (directed to different mobile terminals) being transmitted via a particular power amplifier is about one-half the transmit power of the signals transmitted via a particular power amplifier of transmitter 130 that does not use transmit diversity. Thus, allowing for the increase in capacity. This increase in capacity is obtained without increasing the total power amplifier power capacity. Since there are two power amplifiers 270 and 275 the total power amplifier power capacity P is the same when each power amplifier has a power capacity of ½P, which is one-half the power capacity P of power amplifier 170 of the non-diversity system. (Alternatively, the reduction in transmit power obtained by using transmit diversity allows the power capacity of each of the two power amplifiers 270 and 275 to be one-quarter the power capacity P of the power amplifier 170 used in the non-diversity system with the same capacity, C.)

Figure 5:
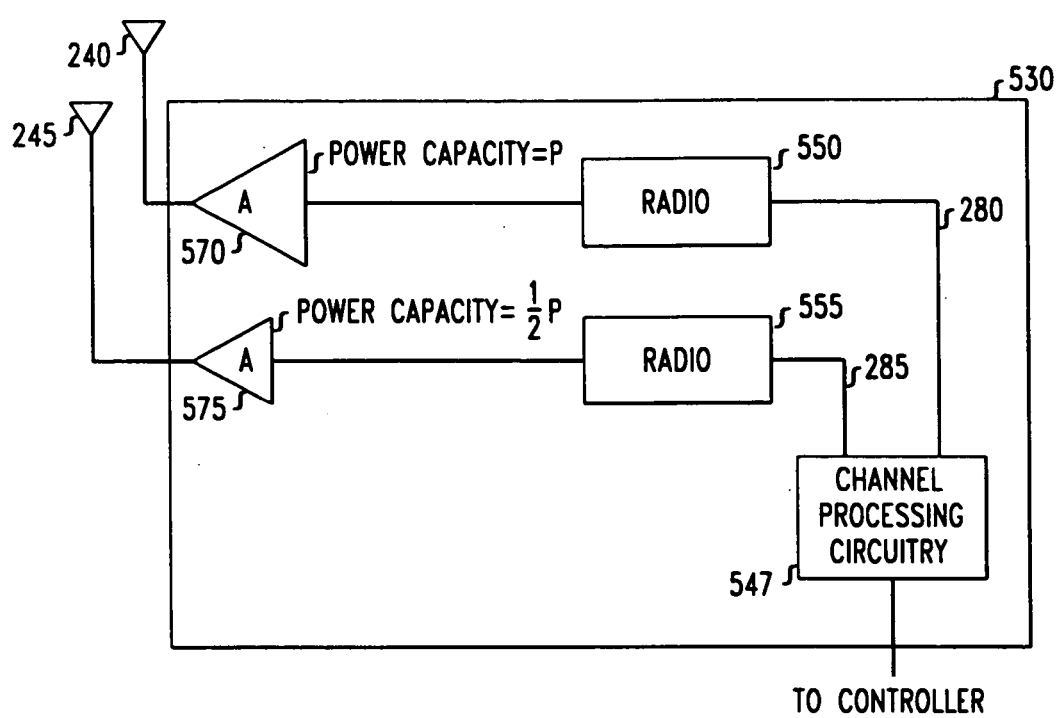
FIG. 5 shows two spaced apart antennas and a portion of a transmitter capable of transmitting signals using transmit diversity as well as transmitting signals not using transmit diversity.

A base station having transmitter 230 is advantageous when all of the mobile terminals are diversity-capable, meaning that they are designed to be able to process and combine the two diversity-encoded signals once they are received at the mobile terminals. Currently most mobile terminals are not diversity-capable. Therefore, it is advantageous for a base station to be able to communicate with diversity-capable mobile terminals as well as with those that are not. FIG. 5 shows transmitter 530 and spaced apart antennas 240 and 245 that can be used in base station 112 to allow base station 112 to communicate with both types of mobile terminals. Transmitter 530 has radios 550 and 555 that provide signals to first power amplifier 570 and second power amplifier 575, respectively, where the signals are amplified. The signals are then transmitted over antennas 240 and 245. When transmitter 530 communicates with a mobile terminal that is not diversity-capable, transmitter 530 operates like transmitter 130 with respect to a particular mobile terminal. In other words the signal to such a mobile terminal is amplified in just first power amplifier 570 and transmitted just over antenna 240. This means that in order for the system that uses transmitter 530 to maintain the same capacity, C, as the system that uses transmitter 130, the power capacity of first power amplifier 570 has to be the same as that of power amplifier 170. Therefore, the power capacity of power amplifier 570 is P. This allows a base station with transmitter 530 to be fully loaded and communicating with only non-diversity-capable mobile terminals. When transmitter 530 communicates with a mobile terminal that is diversity-capable, transmitter 530 operates like transmitter 230 with respect to a particular mobile terminal. This means that second power amplifier 575 can be smaller than first power amplifier 570, since as explained above, the power of the signals transmitted using transmit diversity is smaller than the power of the signals transmitted without using it.

In a base station that uses transmitter 530, at least one (and usually both) of power is amplifiers 570 or 575 is underutilized most of the time. When all of the mobile terminals communicating with transmitter 530 are not diversity-capable, all of the signals transmitted from transmitter 530 are amplified by first power amplifier 570, leaving second power amplifier 575 not utilized. When any of the mobile terminals communicating with transmitter 530 are diversity-capable, the signals to those mobile terminals are amplified by both power amplifiers 570 and 575. If second power amplifier 575 has a smaller power capacity than first power amplifier 570, then first power amplifier 570 is underutilized, thus, at least one power amplifier 570 or 575 is always underutilized. If second power amplifier 575 has the same power capacity as first power amplifier 570, then although first power amplifier 570 may not be underutilized, now second power amplifier 575 has a fairly large power capacity, P, and the more mobile terminals that are not diversity-capable the more of this power capacity is wasted. Because, the cost of the power amplifier is directly proportional to its power capacity, and because power amplifiers used in these types of applications are very expensive (typically 15% to 25% of the entire cost of the base station), the wasted power capacity in both cases can be a significant expense.

Figure 6:
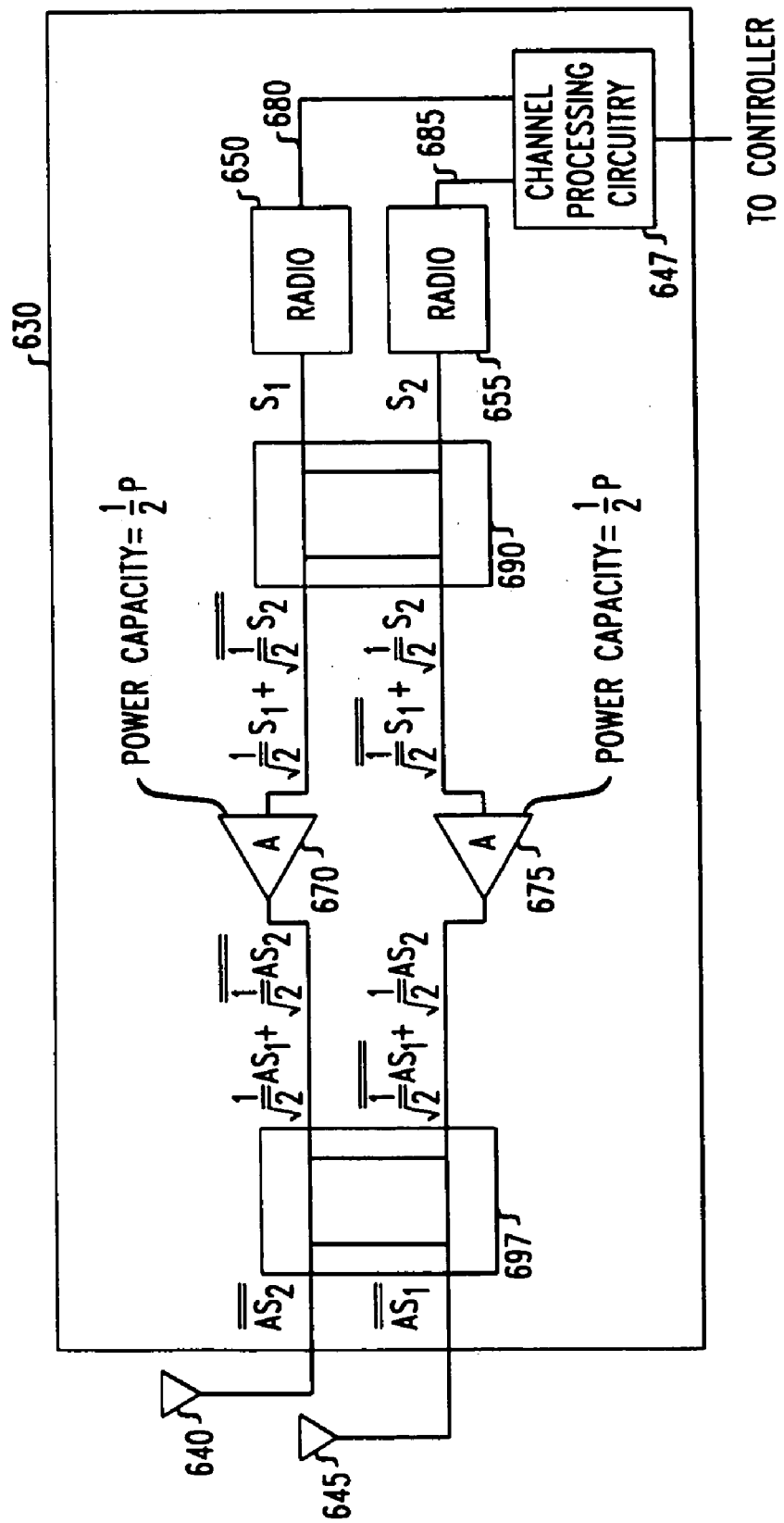
FIG. 6 shows two spaced apart antennas and a portion of a transmitter capable of sharing power amplifiers according to an embodiment of the present invention.

FIG. 6 shows transmitter 630 and spaced apart antennas 640 and 645 that can be used in base station 112 to allow base station 112 to more fully utilize power amplifiers 670 and 675 by sharing the power amplifiers in accordance with the principles of the invention. (As described above, for ease of reference the invention is illustrated with spatial diversity, although any diversity technique can be used with the principles of this invention.)

The operation of one embodiment of transmitter 630 is now described. When the transmitter is communicating with a mobile terminal that is diversity capable, the first signal is provided from the controller to channel processing circuitry 647 where the first signal is replicated into two signals. The manner is which the signal is replicated is dependent on the type of diversity code used, where any diversity code can be used, such as orthogonal diversity or space-time spreading. The latter is described in more detail in 3$^{RD}$ GENERATION PARTNERSHIP PROJECT; TECHNICAL SPECIFICATION GROUP RADIO ACCESS NETWORK; PHYSICAL CHANNELS AND MAPPING OF TRANSPORT CHANNELS ONTO PHYSICAL CHANNELS (FDD), 3 G TS 25.211 V3.1.1, December 1999, incorporated herein by this reference (and more particularly in § 5.3.1.1 "Open loop transmit diversity" (p. 15–19)). Channel processing circuitry then encodes one of the two replicated signals using a first encoding sequence to produce the first diversity-encoded signal and encodes the other of the two replicated signals using a second encoding sequence to produce the second diversity-encoded signal. First and second diversity-encoded signals travel via leads 680 and 685, respectively, to radios 650, 655, respectively, where the each signal is modulated onto an RF signal.

The two diversity-encoded signals are orthogonal to each other. This prevents the two diversity-encoded signals from destructively interfering with each other when they are received at the mobile terminal. The two diversity-encoded signals can be made orthogonal to each other by using a first and a second encoding sequences that are orthogonal to each other. For example, in CDMA communication systems the two encoding sequences can be two different Walsh codes. (Walsh codes are orthogonal encoding sequences used to encode a signal at the transmitter to allow several signals to share the same bandwidth.)

The two diversity-encoded signals are used as the signals $S_1$ and $S_2$ at the inputs of pre-amplifier hybrid combiner 690. Thus, in this case, $S_1$ is the first diversity-encoded signals, and $S_2$ is the second diversity-encoded signal. Pre-amplifier hybrid combiner 690 uses each diversity-encoded signal to form a first and a second composite signal. One embodiment of forming the first and second composite signals is now described where each composite signal includes information represented by each of the two diversity-encoded signals. Pre-amplifier hybrid combiner 690 forms first and second representative signals of $S_1$, with each representative signal containing the information represented by $S_1$ but having half the power of $S_1$. Similarly, first and second representative signals of $S_2$ are formed, with each representative signal containing the information represented by $S_2$ but having half the power of $S_2$. Pre-amplifier hybrid combiner combines the first representative signals of $S_1$ and $S_2$ to form the first composite signal, and combines the second representative signals of $S_1$ and $S_2$ to form the second composite signal.

The first and second composite signals are then amplified in first and second amplifiers 670 and 675, respectively, and provided to a second device, such as a post-amplifier hybrid combiner 697. Post-amplifier hybrid combiner 697 uses the amplified composite signals to form first and second representative signals of each of the amplified composite signals, with each representative signal containing the same content and having half the power as one of the amplified composite signals. Post-amplifier hybrid combiner 697 combines the first representative signals of each of the amplified first and second composite signals to form the amplified first diversity-encoded signal, and combines the second representative signals of each of the amplified first and second composite signal to form the amplified second diversity-encoded signal.

One of the amplified diversity-encoded signals it transmitted over first antenna 640 and the other amplified diversity-encoded signal is transmitted over second antenna 645.

Returning to the pre-amplifier hybrid combiner, pre-amplifier hybrid combiner 690 can be any hybrid combiner. Illustratively, pre-amplifier hybrid combiner 690 is a conventional easy-to-produce hybrid combiner, such as a 90° hybrid combiner. As described in more detail in the next paragraph, pre-amplifier hybrid combiner 690 forms two representative signals of equal power for $S_1$ and two representative signals of equal power for $S_2$. This makes the power of each representative signal ½ the power of the diversity-encoded signals, making the voltage of each representative signal $$\frac{1}{\sqrt{2}}$$

of the voltage of the diversity-encoded signals. When pre-amplifier hybrid combiner 690 is a 90° hybrid combiner, pre-amplifier hybrid combiner 690 shifts the phase of one of the two representative signals of each diversity-encoded signal by 90° without sifting the phase of the other representative signals to produce $$\frac{1}{\sqrt{2}} S_1$$

and $$\frac{\overline{1}}{\sqrt{2}} S_1,$$

and $$\frac{1}{\sqrt{2}} S_2$$

and $$\frac{1}{\sqrt{2}}\overline{S_2},$$

where $\overline{x}$ represents x shifted by 90°. Not-phase-shifted representative signal $$\frac{1}{\sqrt{2}}S_1$$

of $S_1$ is added to phase-shifted representative signal $$\frac{1}{\sqrt{2}}\overline{S_2}$$

of $S_2$ to form first composite signal $$\frac{1}{\sqrt{2}}S_1 + \frac{1}{\sqrt{2}}\overline{S_2}.$$

Not-phase-shifted representative signal $$\frac{1}{\sqrt{2}}S_2$$

of $S_2$ is added to phase-shifted representative signal $$\frac{1}{\sqrt{2}}\overline{S_1}$$

of $S_1$ to form second composite signal $$\frac{1}{\sqrt{2}}\overline{S_1} + \frac{1}{\sqrt{2}}S_2.$$

Thus, the first composite signal is a function of a combination of the first diversity-encoded signal with a phase-shifted version of the second diversity-encoded signal and the second composite signal is a function of a combination of the second diversity-encoded signal with a phase-shifted version of the first diversity-encoded signal.

Figure 6A:
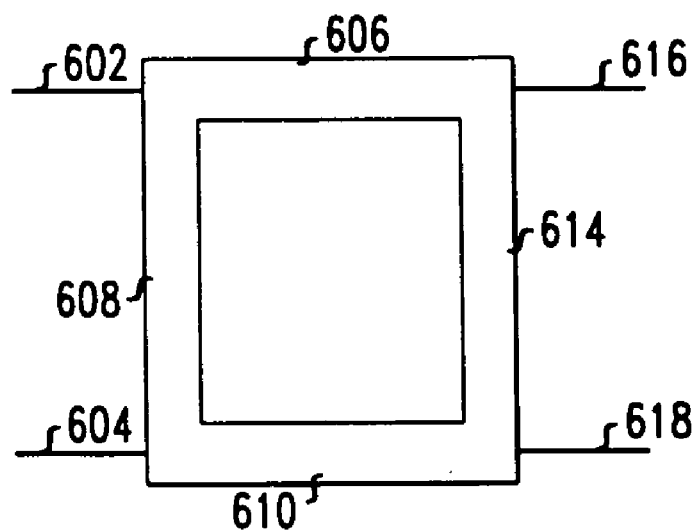
FIG. 6a shows one implementation of a 90° hybrid combiner.

FIG. 6a shows one implementation of pre-amplifier hybrid combiner 690 in more detail. Pre-amplifier hybrid combiner 690 has first and second inputs 602 and 604, respectively, connected to a microstrip path that typically has four portions 606, 608, 610 and 614. First diversity-encoded signal $S_1$ is on first input 602 and second diversity-encoded signal $S_2$ is on second input 604. As $S_1$ enters the microstrip path it divides into two representative signals $$\frac{1}{\sqrt{2}}S_1$$

and $$\frac{1}{\sqrt{2}}S_1,$$

the first representative signal starts to travel on portion 606 and the second on portion 608. $S_2$ also divides into two representative signals $$\frac{1}{\sqrt{2}}S_2$$

and $$\frac{1}{\sqrt{2}}S_2,$$

the first representative signal starts to travel on portion 608 and the second on 610. The first representative signal of $S_2$ travels via portion 608 to the juncture of portions 608 and 606. Traveling the length of portion 608 shifts the phase of the first representative signal of $S_2$ by 90°. (Note that because the first and second representative signals of $S_2$ travel an equal length via path 610 and 606 the two representative signals of $S_2$ remain 90° out of phase.) At the juncture of portions 608 and 606 phase shifted first representative signal $$\frac{1}{\sqrt{2}}\overline{S_2}$$

of $S_2$ combines with the first representative signal $$\frac{1}{\sqrt{2}}S_1$$

of $S_1$, to form first composite signal $$\frac{1}{\sqrt{2}}S_1 + \frac{1}{\sqrt{2}}\overline{S_2}.$$

The first composite signal travels via portion 606 to first output 616. The second representative signal of $S_1$ travels via portion 608 to the juncture of portions 608 and 610, which shifts the phase of the second representative signal of $S_1$ by 90°. At the juncture of portions 608 and 610, phase shifted second representative signal $$\frac{1}{\sqrt{2}}S_1$$

of $S_1$ combines with second representative signal $$\frac{1}{\sqrt{2}}S_2$$

of $S_2$ to form second composite signal $$\frac{1}{\sqrt{2}}S_2 + \overline{\frac{1}{\sqrt{2}}S_1}.$$

The second composite signal travels via portion 610 to second output 618.

The first composite signal is then amplified in power amplifier 670 and the second composite signal is amplified in power amplifier 675, where each of the power amplifiers have a gain of A.

Note that the power of each of the first and the second composite signal is one-half the power of $S_1$ plus one half the power of $S_2$. Thus, the power of each of the composite signals is half of the sum of the power of the first and second diversity-encoded signals, which is half of the power of the first signal. Therefore, only half of the power of the first signal is amplified in each of the amplifiers.

The two amplified composite signals $$\frac{1}{\sqrt{2}}AS_1 + \overline{\frac{1}{\sqrt{2}}AS_2}$$

and $$\overline{\frac{1}{\sqrt{2}}AS_1} + \frac{1}{\sqrt{2}}AS_2$$

are provided to post-amplifier hybrid combiner 697. As described above, post-amplifier hybrid combiner 697 should provide an amplified first diversity-encoded signal and an amplified second diversity-encoded signal. (Note that for the purposes of this invention it is not material whether the amplified diversity-encoded signals are in or out of phase with the diversity-encoded signals. However if it is advantageous for a particular application that the amplified diversity-encoded signals be in phase with the diversity-encoded signals, this can be accommodated in the transmitter design. For example, pre- and post-amplifier hybrid combiners, can be 180° combiners as described below.) When pre-amplifier hybrid combiner 690 is a 90° hybrid combiner, post-amplifier hybrid combiner 697 can also be a 90° hybrid combiner.

Post-amplifier hybrid combiner 697 forms two representative signals of equal power for each amplified composite signal $$\frac{1}{\sqrt{2}}AS_1 + \overline{\frac{1}{\sqrt{2}}AS_2}$$

and $$\overline{\frac{1}{\sqrt{2}}AS_1} + \frac{1}{\sqrt{2}}AS_2.$$

The power of the first composite signal is $(\frac{1}{2}A)^2$ times the power of $S_1$ plus $(\frac{1}{2}A)^2$ times the power of $S_2$, making the voltage of each representative signal of the amplified composite signal $\frac{1}{2}A$ times of the voltage of $S_1$ plus $\frac{1}{2}A$ times the voltage of $S_2$. The power of the second composite signal is also $(\frac{1}{2}A)^2$ times the power of $S_1$ plus $(\frac{1}{2}A)^2$ times the power of $S_2$, making the voltage of each representative signal of the second composite signal $\frac{1}{2}A$ times the voltage of $S_1$ plus $\frac{1}{2}A$ times the voltage of $S_2$.

After forming the representative signals, post-amplifier hybrid combiner 697 shifts one of the two representative signals of each amplified composite signal by 90° to produce:

$$\tfrac{1}{2}AS_1 + \overline{\tfrac{1}{2}AS_2}, \tag{1}$$

the not-phase-shifted representative signal of the amplified first composite signal, $$\overline{\tfrac{1}{2}AS_1} + \overline{\tfrac{1}{2}AS_2}, \text{ (where } \bar{x} \text{ is x shifted by } 180°\text{)} \tag{2}$$

the phase-shifted representative signal of the amplified first composite signal, $$\overline{\tfrac{1}{2}AS_1} + \tfrac{1}{2}AS_2, \tag{3}$$

the not-phase-shifted representative signal of the amplified second composite signal, and $$\overline{\tfrac{1}{2}AS_1} + \tfrac{1}{2}AS_2, \tag{4}$$

the phase-shifted representative signal of the amplified second composite signal.

The not-phase-shifted representative signal of the amplified first composite signal is added to the phase-shifted representative signal of the amplified second composite signal to produce:

$$\tfrac{1}{2}AS_1 + \overline{\tfrac{1}{2}AS_2} + \overline{\tfrac{1}{2}AS_1} + \tfrac{1}{2}AS_2 = \tfrac{1}{2}AS_1 + \overline{\tfrac{1}{2}AS_1} + \overline{AS_2} \tag{5}$$

at a first output of post-amplifier hybrid combiner 697. Since, $\tfrac{1}{2}AS_1 + \overline{\tfrac{1}{2}AS_1}$ is equal to zero, equation 5 is equal to $\overline{AS_2}$, which is an amplified (and phase shifted) second diversity-encoded signal. Thus, the amplified second diversity-encoded signal is formed from the amplified first and second composite signals. More particularly, in this case the amplified first diversity-encoded signal is a function of a combination of the first composite signal with a phase-shifted version of the second composite signal.

This amplified second diversity-encoded signal is then transmitted to the mobile terminal via antenna 640.

The not-phase-shifted representative signal of the amplified second composite signal is added to the phase-shifted representative signal of the amplified first composite signal to produce:

$$\tfrac{1}{2}AS_1 + \overline{\tfrac{1}{2}AS_2} + \overline{\tfrac{1}{2}AS_1} + \tfrac{1}{2}AS_2 = \overline{AS_1} + \tfrac{1}{2}AS_2 + \overline{\tfrac{1}{2}AS_2} \tag{6}$$

at a second output of post-amplifier hybrid combiner 697. Since ½AS₂+½AS₂ is equal to zero, equation 6 is equal to $\overline{AS_1}$, which is an amplified (and phase shifted) first diversity-encoded signal. Thus, the amplified first diversity-encoded signal is formed as a function of the amplified first and second composite signals. More particularly, in this case, the amplified first diversity-encoded signal is a function of a combination of the second composite signal with a phase-shifted version of the first composite signal.

This amplified first diversity-encoded signal is then transmitted to the mobile terminal via antenna 645.

Transmitter 630 operates similarly when it is communicating with a mobile terminal that is not diversity-capable except the signal that is to be transmitted to the mobile terminal, referred to herein as the second signal, is not replicated using diversity coding but is encoded by channel processing circuitry 647 using the first encoding sequence. The result then goes to radio 650 via lead 680, where it is modulated onto an RF signal. The (encoded) second signal is the signal $S_1$ at a first input of pre-amplifier hybrid combiner 690, and there is no signal at a second input of pre-amplifier hybrid combiner 690, so $S_1$=the second signal and $S_2$=0. With $S_2$=0, first composite signal becomes $$\frac{1}{\sqrt{2}}S_1$$

and second composite signal $$\overline{\frac{1}{\sqrt{2}}S_1}.$$

Thus, in this case the first and second composite signals are a function of the second signal. The first composite signal is amplified in power amplifier 670 and the second composite signal is amplified in power amplifier 675.

Therefore, in this case, only half of the second signal is amplified in each of the power amplifiers. This means that the power level of the signal going through each power amplifier is one-half of the power of the total signal, allowing the use of power amplifiers with half the power capacity, ½P, of power amplifier 170 of transmitter 130, which does not use transmit diversity.

With $S_2$=0, there is no signal at the first output of post-amplifier hybrid combiner 697, and $\overline{AS_1}$ is produced at the second output of post-amplifier hybrid combiner 697. $\overline{AS_1}$ is an amplified (encoded and phase shifted) second signal. Thus, the amplified second signal is formed as a function the amplified composite signals. The amplified second signal is then transmitted to the mobile terminal via antenna 645 (and there is no signal transmitted over antenna 640).

At any particular point in time, transmitter 630 can be communicating with mobile terminals that are diversity-capable, with mobile terminals that are not diversity-capable, or with both. Therefore, (1) transmitter 630 can share the amplification of the first and second diversity-encoded signals between its amplifiers 670 and 675, or (2) transmitter 630 can share the amplification of the second signal between its amplifiers 670 and 675, or both (1) and (2) concurrently.

Amplifier Sharing Using 180° Hybrid Combiners.

Figure 7:
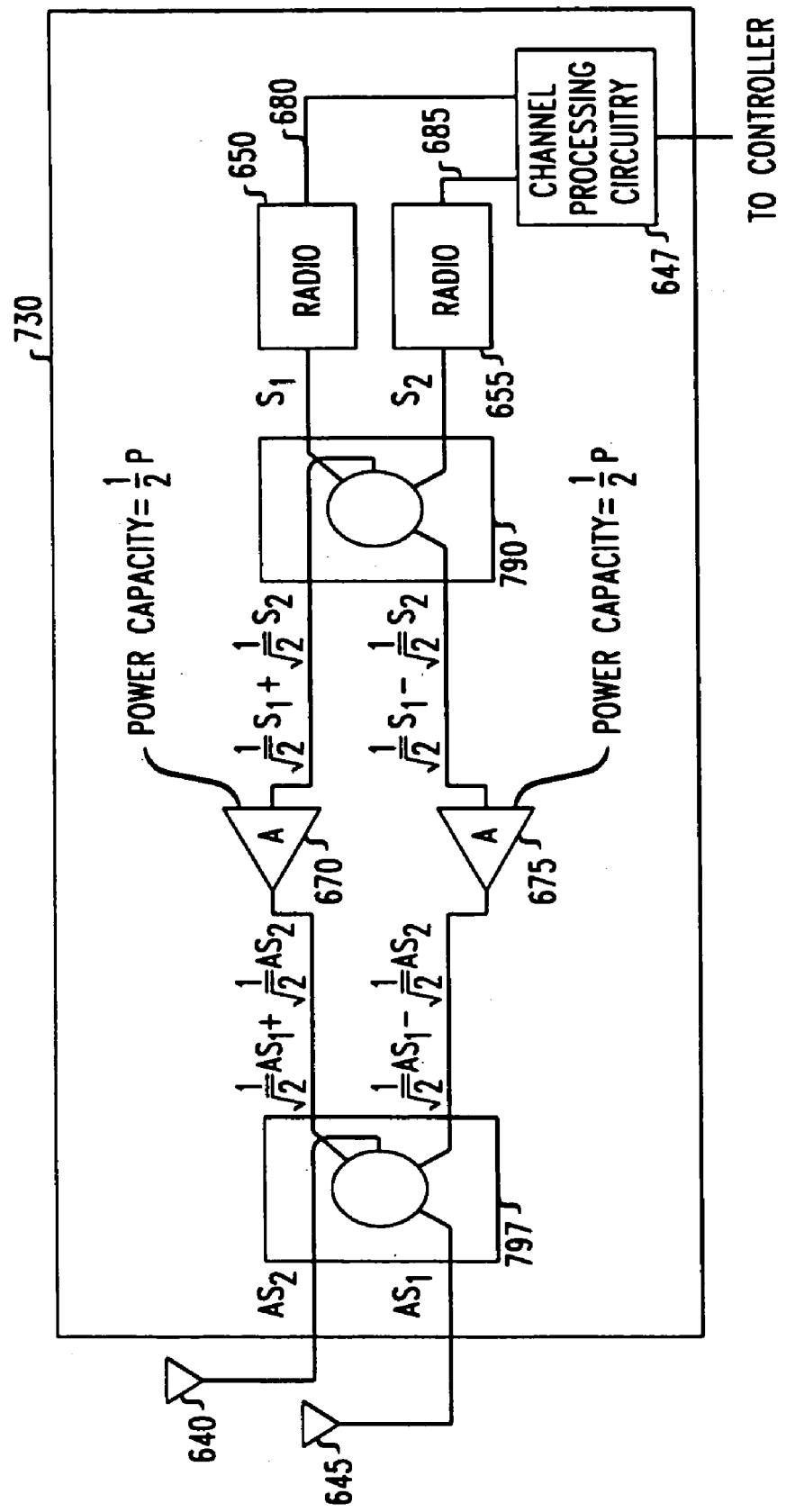
FIG. 7 shows two spaced apart antennas and a portion of a transmitter capable of sharing power amplifiers according to another embodiment of the present invention.

Transmitter 630 was described with the pre- and post-amplifier hybrid combiners being 90° hybrid combiners. As described above, the hybrid combiners can be any types of hybrid combiners as long as an amplified first diversity-encoded signal is provided to one of two antennas and an amplified second diversity-encoded signal is provided to the other of the two antennas. For example, both hybrid combiners can be 180° hybrid combiners. FIG. 7 shows the operation of transmitter 730 where pre-amplifier hybrid combiner 790 and post-amplifier hybrid combiner 797 are 180° hybrid combiners. When transmitter 730 is communicating with a mobile terminal that is diversity capable, the first signal that is to be transmitted to the mobile terminal is replicated and encoded by channel processing circuitry 647 as described above to produce first diversity-encoded signal and second diversity-encoded signal, which are then modulated onto an RF signal by radios 650 and 655, respectively. Pre-amplifier hybrid combiner 790 uses the diversity-encoded signals as the signals $S_1$ and $S_2$. Pre-amplifier hybrid combiner 790 forms two representative signals of equal power for each diversity-encoded signal. Pre-amplifier hybrid combiner provides at its first output the first composite signal, which is the sum of one representative signal of each of $S_1$ and $S_2$:

$$\frac{1}{\sqrt{2}}S_1 + \frac{1}{\sqrt{2}}S_2 \tag{7}$$

Thus, the first composite signal is a function of the sum of the first diversity-encoded signal and of the second diversity-encoded signal.

Pre-amplifier hybrid combiner 790 also provides the second at its second output composite signal, which is the difference between one representative signal of each of $S_1$ and $S_2$:

$$\frac{1}{\sqrt{2}}S_1 - \frac{1}{\sqrt{2}}S_2 \tag{8}$$

Thus, the second composite signal is a function of the difference between the first diversity-encoded signal and the second diversity-encoded signal.

Figure 7A:
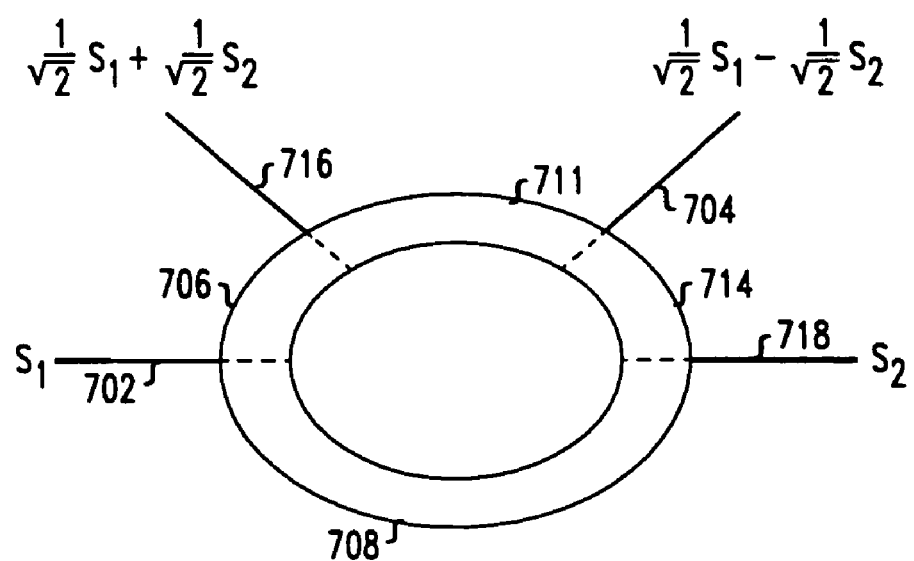
FIG. 7a shows one implementation of a 180° hybrid combiner.

FIG. 7a shows one implementation of pre-amplifier hybrid combiner 790 in more detail. Pre-amplifier hybrid combiner 790 has first and second inputs 702 and 704, respectively, connected to a microstrip path that in a 180° hybrid combiner can be thought of as having portions 706, 708, 711 and 714. First diversity-encoded signal $S_1$ is on first input 702 and second diversity-encoded signal $S_2$ is on second input 704. As $S_1$ enters the microstrip path it divides into two representative signals, the first representative signal starts to travel on portion 706 and the second on portion 708. $S_2$ also divides into two representative signals, the first representative signal starts to travel on portion 711 and the second on 714. The first representative signals $$\frac{1}{\sqrt{2}}S_1$$

and $$\frac{1}{\sqrt{2}}S_2$$

of $S_1$ and of $S_2$, respectively, travel via portions 706 and 711, respectively, to the juncture of portions 711 and 706 where the two representative signals combine to form the first composite signal $$\frac{1}{\sqrt{2}}S_1 + \frac{1}{\sqrt{2}}S_2,$$

which is provided to first output 716. The second representative signals $$\frac{1}{\sqrt{2}}S_1$$

and $$\frac{1}{\sqrt{2}}S_2$$

of $S_1$ and $S_2$, respectively, travel via portion 708 and 714, respectively, to the juncture of portions 708 and 714 where the two representative signals combine to form the second composite signal $$\frac{1}{\sqrt{2}}S_1 - \frac{1}{\sqrt{2}}S_2,$$

which is provided to second output 718.

The first composite signal is amplified in power amplifier 670 and the second composite signal is amplified in power amplifier 675. The power of each of the first and second composite signals is one half the power of $S_1$ plus one half the power of $S_2$. This is half of the sum of the power of the first and second diversity-encoded signals, which is half of the power of the first signal. Therefore, only half of the power of the first signal is amplified in each of the amplifiers.

Post-amplifier hybrid combiner 797 forms two representative signals of equal power for each amplified composite signal. The power of the first composite signal is $(\frac{1}{2}A)^2$ times the power of $S_1$ plus $(\frac{1}{2}A)^2$ times the power of $S_2$, making the voltage of each representative signal of the first amplified composite signal to be $\frac{1}{2}A$ times the voltage of $S_1$ plus $\frac{1}{2}A$ times the voltage of $S_2$. The power of the second composite signal is also $(\frac{1}{2}A)^2$ times the power of $S_1$ plus $(\frac{1}{2}A)^2$ times the power of $S_2$, making the voltage of each representative signal of the amplified composite signal to be $\frac{1}{2}A$ times the voltage of $S_1$ plus $\frac{1}{2}A$ times the voltage of $S_2$.

At its first output, post-amplifier hybrid combiner 797 provides the sum of one representative signal of each of the amplified first and second composite signals:

$$\tfrac{1}{2}AS_1 + \tfrac{1}{2}AS_2 + \tfrac{1}{2}AS_1 - \tfrac{1}{2}AS_2 = AS_1. \tag{9}$$

$AS_1$ is the amplified first diversity-encoded signal. Thus, the amplified first diversity-encoded signal is formed as a function of a sum of the amplified first composite signal and the amplified second composite signal. This amplified first diversity-encoded signal is then transmitted to the mobile terminal via antenna 640.

At its second output, post-amplifier hybrid combiner 797 provides the difference between one representative signal of each of the amplified first and second composite signals:

$$\tfrac{1}{2}AS_1 + \tfrac{1}{2}AS_2 - [\tfrac{1}{2}AS_1 - \tfrac{1}{2}AS_2] = \tfrac{1}{2}AS_1 + \tfrac{1}{2}AS_2 - \tfrac{1}{2}AS_1 + \tfrac{1}{2}AS_2 = AS_2. \tag{10}$$

$AS_2$ is the amplified second diversity-encoded signal. Thus the amplified second diversity-encoded signal is a function of a difference of the amplified first composite signal and the amplified second composite signal. This amplified second diversity-encoded signal is then transmitted to the mobile terminal via antenna 645.

When transmitter 730 is communicating with a non diversity-capable mobile terminal, the signal that is to be transmitted to the mobile terminal, referred to herein as the second signal, is processed by channel processing circuitry 647 and one of the two radios, for example radio 650, as described above for communicating with non diversity capable mobile terminals. In this case $S_1$ is the second signal and $S_2=0$. With $S_2=0$, both first and second composite signals are $$\frac{1}{\sqrt{2}}S_1.$$

The first composite signal is amplified in power amplifier 670 and the second composite signal is amplified in power amplifier 675. Therefore, only half of the second signal is amplified in each of the power amplifiers. This means that the power level of the signal going through each power amplifier is one-half of the power of the second signal. This allows the use of power amplifiers with a half power capacity $\frac{1}{2}P$ of the power amplifier 170 of transmitter 130 that does not use transmit diversity.

Referring to equations 9 and 10, with $S_2=0$, $AS_1$ is produced at a first output of post-amplifier hybrid combiner 797 and there is no signal at the second output of post-amplifier hybrid combiner 797. $AS_1$ is the amplified (encoded) second signal. This signal is transmitted to the mobile terminal via antenna 640, and there is nothing to transmit at over antenna 645.

Amplifier Sharing with Digital Pre-Distortion

A significant goal in prior art amplifier-sharing arrangements is to avoid having to phase and gain match radios 650 and 655 to produce acceptable antenna isolation tolerance. This is readily achieved by forming the composite signals in the analog domain, i.e. using analog circuitry, such as for example, using analog pre-amplifier hybrid combiners 690 and 790, as described above.

Figure 7B:
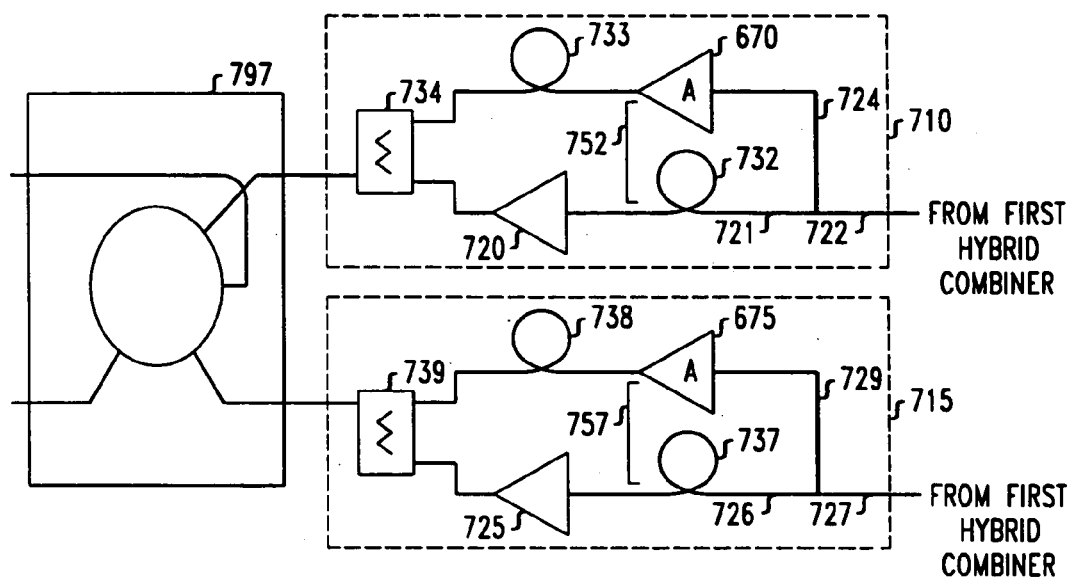
FIG. 7b shows conventional feed-forward loops used to compensate for the non-linearity of the power amplifiers.

It is advantageous for amplifiers 670 and 675 to be linear; otherwise the signal going through them is distorted. As shown in FIG. 7b, feed-forward loops 710 and 715 following the amplification can be used to compensate for non-linearities that occur at high power levels. Inasmuch as the composite signals are formed in the analog domain for the reasons just stated, the feed-forward loop is also implemented in the analog domain. The first composite signal travels from lead 722 to leads 724 and 721, with the signal on lead 721 having a much lower power than the first composite signal. This signal is delayed in delay line 732 while the first composite signal is amplified in power amplifier 670. Circuitry 752 isolates the distortion in the first composite signal generated by power amplifier 670 (typically, by comparing the amplified first composite signal with a function of the signal on lead 721) and provides the distortion to correction amplifier 720. Amplifier 720 amplifies the distortion correction, while the amplified-distorted first composite signal is delayed in delay line 733 to ensure that the amplified-distorted first composite signal and the distortion correction arrive at coupler 734 at the same time. Coupler 734 combines the amplified-distorted first composite signal and the amplified distortion correction to cancel the distortion and produce the amplified first composite signal. Feed-forward loop 715 performs the same function for the second composite signal, to produce amplified second composite signal at the output of coupler 739.

Feed-forward loops 710 and 715 can provide good compensation for non-linearity. However, the fact that they must be implemented using analog circuitry leads to several problems. One problem is that the analog circuitry is expensive. Another problem is that it produces inefficiencies due to the power loses that result from the signal passing through the delay lines 733 and 738 and couplers 734 and 739. A third problem is that analog circuitry is more prone to fail than digital circuitry.

Figure 8:
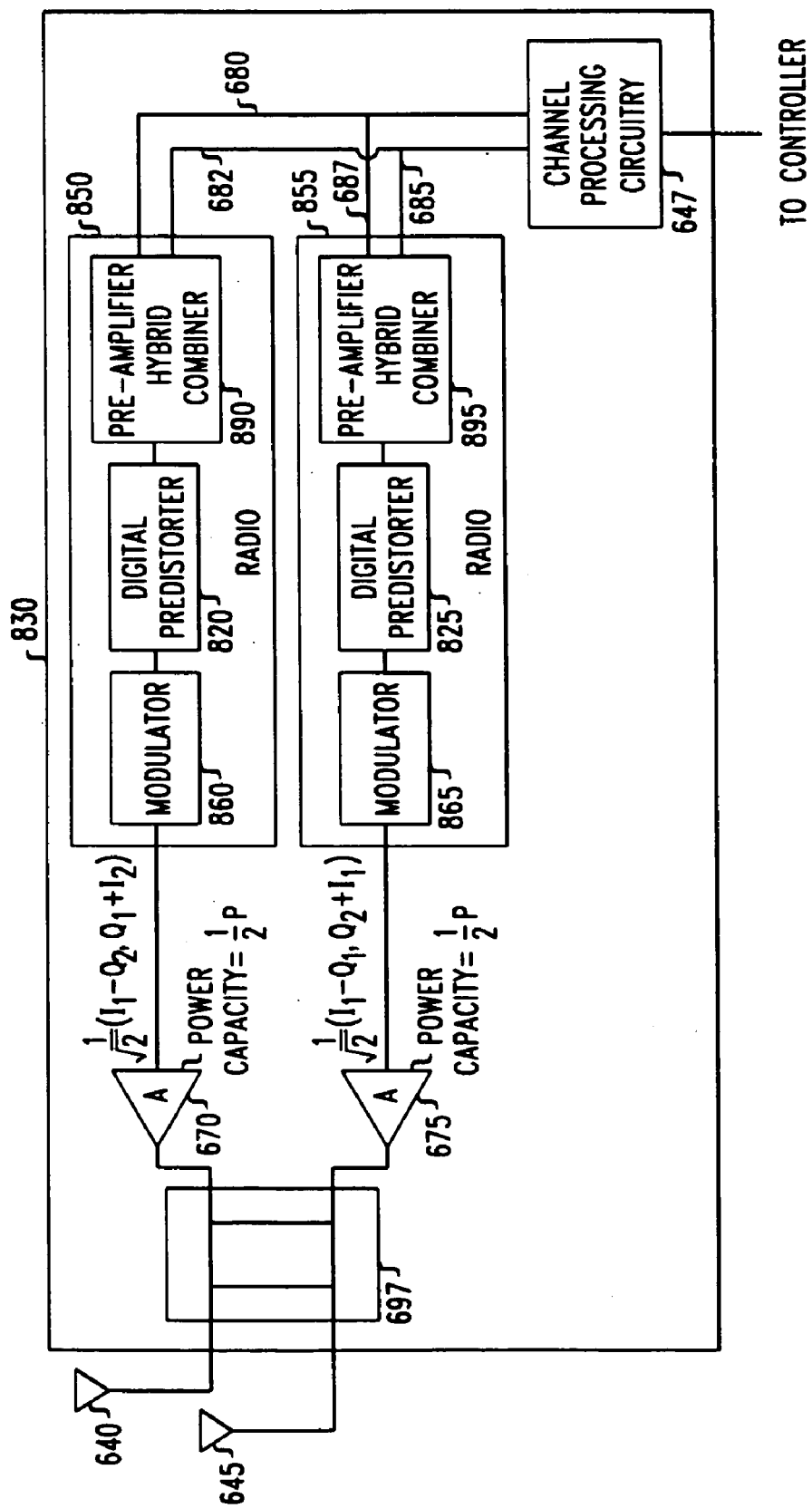
FIG. 8 shows two spaced apart antennas and a portion of a transmitter capable of sharing power amplifiers according to another embodiment of the present invention.

FIG. 8 shows transmitter 830 that solves the above problems by forming the composite signals in the digital domain, i.e. using digital circuitry, so that digital pre-distortion can be used to pre-distort the composite signals as described in co-pending U.S. patent application "Power Amplifier Sharing In A Wireless Communication System With Amplifier Pre-Distortion", Ser. No. 09/631,886 filed on the same date and assigned to the same Assignee hereof, and incorporated herein by this reference. Although the prior art has been wedded to the idea of forming the composite signals in the analog domain so as to avoid having to phase and gain match the radios to produce acceptable antenna isolation tolerances, as mentioned above. Applicants have realized that, in a system where amplifiers are shared, the advantages of digital pre-distortion can outweigh those difficulties. Digitally pre-distorting signals that are amplified in shared amplifiers compensates for the non-linearity of the amplifiers without the expense, inefficiencies, and increased possibility of circuit failure of an analog feed-forward loop.

Transmitter 830 forms the composite signals in the digital domain using pre-amplifier hybrid combiners 890 and 895. Each composite signal includes information represented by each of the two diversity-encoded signals. Each composite signal is digitally pre-distorted in one of the digital predistorters 820 and 825 and then modulated onto a transmission frequency signal, such as an RF signal, in modulator 860 and 865. Each pre-distorted composite signal is then amplified in a respective amplifier 670 and 675. Post-amplifier hybrid combiner 697 uses the amplified composite signals to form amplified versions of the signals that are to be transmitted.

The operation of transmitter 830 is now described in more detail. When transmitter 830 is communicating with a mobile terminal that is diversity capable, the first signal (i.e. the signal that is to be transmitted to the mobile terminal) is provided to channel processing circuitry 647 that replicates the first signal using a diversity code, such as orthogonal diversity or space-time spreading, in the same manner as described above to produce first diversity-encoded signal and second diversity-encoded signal. Both the first and second diversity-encoded signals are provided to both radios 850 and 855 via leads 680, 682 and 685 and 687. Radios 850 and 855 use the diversity-encoded signals as the signals $S_1$ and $S_2$, each of which is provided to the two digital pre-amplifier hybrid combiners 890 and 895.

A digital signal can be expressed in terms of its real component I and quadrature component Q (where Q is also sometimes referred to as the imaginary component). Therefore, first diversity-encoded signal S1 can be expressed as $(I_1, Q_1)$ and second diversity-encoded signal $S_2$ can be expressed as $(I_2, Q_2)$.

Similarly to the analog pre-amplifier hybrid combiners, digital pre-amplifier hybrid combiners 890 and 895 can be any hybrid combiners. When pre-amplifier hybrid combiners 890 and 895 are 90° hybrid combiners, first pre-amplifier hybrid combiner 890 forms first representative signals of $S_1$ and of $S_2$, each representative signal representing the same information as its respective diversity-encoded signal ($S_1$ or $S_2$). Second pre-amplifier hybrid combiner 895 forms second representative signals of $S_1$ and of $S_2$, each representative signal representing the same information as its respective diversity-encoded signal ($S_1$ or $S_2$). The power of each representative signal will be ½ the power of the diversity-encoded signals, making the voltage of each representative signal $$\frac{1}{\sqrt{2}}$$

of the voltage of the diversity-encoded signals. Therefore, first pre-amplifier hybrid combiner 890 forms representative signals $$\left(\frac{1}{\sqrt{2}}I_1, \frac{1}{\sqrt{2}}Q_1\right)$$

from $S_1$ and $$\left(\frac{1}{\sqrt{2}}I_2, \frac{1}{\sqrt{2}}Q_2\right)$$

from $S_2$ and second pre-amplifier hybrid combiner 895 forms representative signals $$\left(\frac{1}{\sqrt{2}}I_1, \frac{1}{\sqrt{2}}Q_1\right)$$

from $S_1$ and $$\left(\frac{1}{\sqrt{2}}I_2, \frac{1}{\sqrt{2}}Q_2\right)$$

from $S_2$. Each re-amplifier hybrid combiners 890 and 895 then shifts one of the two representative signals by 90° without shifting the other representative signals, and combine the not-shifted-representative signal with the shifted representative signal to form the composite signals. Shifting a signal by 90° can be accomplished by swapping the values of the real and quadrature components. Thus, after shifting the representative signals of $S_1$ are $$\left(\frac{1}{\sqrt{2}}I_1, \frac{1}{\sqrt{2}}Q_1\right)$$

and $$\left(-\frac{1}{\sqrt{2}}Q_1, \frac{1}{\sqrt{2}}I_1\right),$$

and the representative signals of $S_2$ are $$\left(\frac{1}{\sqrt{2}}I_2, \frac{1}{\sqrt{2}}Q_2\right)$$

and $$\left(-\frac{1}{\sqrt{2}}Q_2, \frac{1}{\sqrt{2}}I_2\right).$$

First pre-amplifier hybrid combiner 890 adds the not-phase-shifted representative signal $$\left(\frac{1}{\sqrt{2}}I_1, \frac{1}{\sqrt{2}}Q_1\right)$$

of $S_1$ to the phase-shifted representative signal $$\left(-\frac{1}{\sqrt{2}}Q_2, \frac{1}{\sqrt{2}}I_2\right)$$

of $S_2$ to form first composite signal $$\left(\frac{1}{\sqrt{2}}I_1 - \frac{1}{\sqrt{2}}Q_2, \frac{1}{\sqrt{2}}Q_1 + \frac{1}{\sqrt{2}}I_2\right).$$

Second pre-amplifier hybrid combiner adds the not-phase-shifted representative signal $$\left(\frac{1}{\sqrt{2}}I_2, \frac{1}{\sqrt{2}}Q_2\right)$$

of the $S_2$ to the phase-shifted representative signal $$\left(-\frac{1}{\sqrt{2}}Q_1, \frac{1}{\sqrt{2}}I_1\right)$$

of $S_1$ to form second composite signal $$\left(\frac{1}{\sqrt{2}}I_2 - \frac{1}{\sqrt{2}}Q_1, \frac{1}{\sqrt{2}}Q_2 + \frac{1}{\sqrt{2}}I_1\right).$$

Figure 8A:
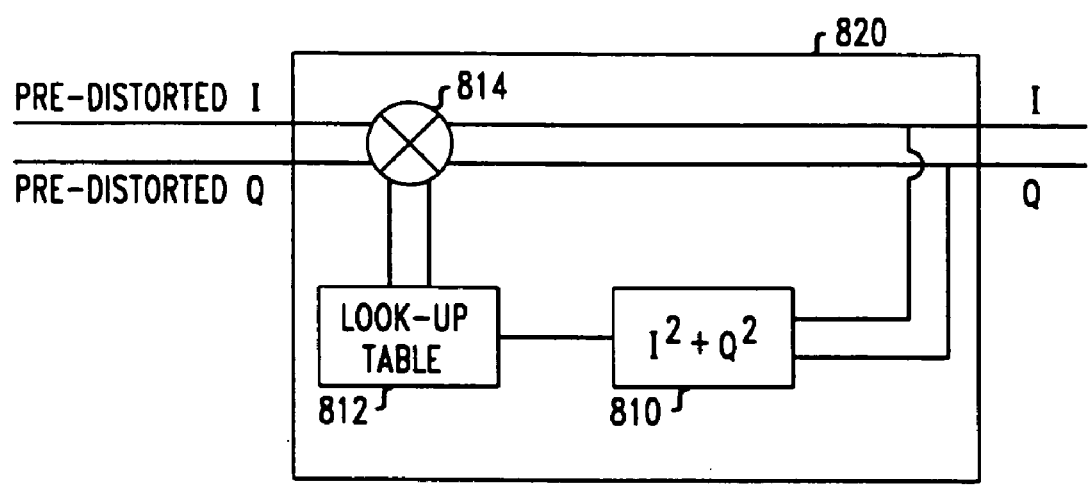
FIG. 8a shows a digital predistorter.

Digital pre-distortion is then performed on the composite signals. FIG. 8*a* shows digital first predistorter 820 in more detail. The digital predistorter determines the power of the first composite signal in circuit 810 by squaring the I and Q components of the first composite signal and then combining the result. The power is then looked up in look-up table 812 that correlates the power with the distortion correction for power amplifier 670. The distortion correction is the amount that needs to be added to the power of the first composite signal that would compensate for any non-linearity of power amplifier 670 at this power.

RF section 860 of radio 850 then modulates the first composite signal onto an RF signal and RF section 865 of radio 855 modulates the second composite signal onto an RF signal. (Both RF sections 860 and 865 typically include a modulator.) RF sections 860 and 865 should be phase and gain matched to produce appropriate antenna isolation tolerances, as described below. The modulated first composite signal is then amplified in power amplifier 670 and the modulated second composite signal is amplified in power amplifier 675, where each of the power amplifiers have a gain of A.

Note that the power of each of the first and the second composite signal is one-half the power of $S_1$ plus one half the power of $S_2$. Thus, the power of each of the composite signals is half of the sum of the power of the first and second diversity-encoded signals, which is half of the power of the first signal received from the transmit circuitry. Therefore, only half of the power of the first signal is amplified in each of the amplifiers.

The two amplified composite signals $$\left(\frac{1}{\sqrt{2}}AI_1 - \frac{1}{\sqrt{2}}AQ_2, \frac{1}{\sqrt{2}}AQ_1 + \frac{1}{\sqrt{2}}AI_2\right),$$

and $$\left(\frac{1}{\sqrt{2}}AI_2 - \frac{1}{\sqrt{2}}AQ_1, \frac{1}{\sqrt{2}}AQ_2 + \frac{1}{\sqrt{2}}AI_1\right)$$

are provided to post-amplifier hybrid combiner 697. As described above, post-amplifier hybrid combiner 697 should provide an amplified first diversity-encoded signal and an amplified second diversity-encoded signal. (Note that for the purposes of this invention it is not material whether the amplified diversity-encoded signals are in or out of phase with the diversity-encoded signals.) When pre-amplifier hybrid combiners 890 and 895 are 90° hybrid combiners, post-amplifier hybrid combiner 697 can also be a 90° hybrid combiner.

Post-amplifier hybrid combiner 697 uses each amplified composite signal $$\left(\frac{1}{\sqrt{2}}AI_1 - \frac{1}{\sqrt{2}}AQ_2, \frac{1}{\sqrt{2}}AQ_1 + \frac{1}{\sqrt{2}}AI_2\right),$$

and $$\left(\frac{1}{\sqrt{2}}AI_2 - \frac{1}{\sqrt{2}}AQ_1, \frac{1}{\sqrt{2}}AQ_2 + \frac{1}{\sqrt{2}}AI_1\right)$$

to form two representative signals of equal power for each amplified composite signal.

The power of the first composite signal is ($\frac{1}{2}$A)$^2$ the power of S$_1$ plus ($\frac{1}{2}$A)$^2$ the power of S$_2$, making the voltage of each representative signal of the amplified composite signal $\frac{1}{2}$A of the voltage of S$_1$ plus $\frac{1}{2}$A the voltage of S$_2$. The power of the second composite signal is also ($\frac{1}{2}$A)$^2$ the power of S$_1$ plus ($\frac{1}{2}$A)$^2$ the power of S$_2$, making the voltage of each representative signal of the second composite signal $\frac{1}{2}$A the voltage of S$_1$ plus $\frac{1}{2}$A the voltage of S$_2$.

After forming the representative signals, post-amplifier hybrid combiner 697 shifts one of the two representative signals of each amplified composite signal by 90° to produce:

$$(\tfrac{1}{2}AI_1 - \tfrac{1}{2}AQ_2, \tfrac{1}{2}AQ_1 + \tfrac{1}{2}AI_2), \qquad (11)$$

the not-phase-shifted representative signal of the amplified first composite signal, $$(-\tfrac{1}{2}AQ_1 - \tfrac{1}{2}AI_2, \tfrac{1}{2}AI_1 - \tfrac{1}{2}AQ_2), \qquad (12)$$

the phase-shifted representative signal of the amplified first composite signal, $$(\tfrac{1}{2}AI_2 - \tfrac{1}{2}AQ_1, \tfrac{1}{2}AQ_2 + \tfrac{1}{2}AI_1), \qquad (13)$$

the not-phase-shifted representative signal of the amplified second composite signal, and $$(-\tfrac{1}{2}AQ_2 - \tfrac{1}{2}AI_1, \tfrac{1}{2}AI_2 - \tfrac{1}{2}AQ_1) \qquad (14)$$

the phase-shifted representative signal of the amplified second composite signal.

The not-phase-shifted representative signal of the amplified first composite signal is added to the phase-shifted representative signal of the amplified second composite signal to produce:

$$([\tfrac{1}{2}AI_1 - \tfrac{1}{2}AQ_2] + [-\tfrac{1}{2}AQ_2 - \tfrac{1}{2}AI_1], [\tfrac{1}{2}AQ_1 + \tfrac{1}{2}AI_2] + [\tfrac{1}{2}AI_2 - \tfrac{1}{2}AQ_1]) = (-AQ_2, AI_2) \qquad (15)$$

at a first output of post-amplifier hybrid combiner 697. As described above, shifting a signal by 90° can be accomplished by swapping the values the real and quadrature components. Thus, (−AQ$_2$,AI$_2$) is a phase-shifted amplified version of the second diversity-encoded signal. This signal is then transmitted to the mobile terminal via antenna 640.

The not-phase-shifted representative signal of the second composite signal is added to the phase-shifted representative signal of the first composite signal to produce:

$$([\tfrac{1}{2}AI_2 - \tfrac{1}{2}AQ_1] + [-\tfrac{1}{2}AQ_1 - \tfrac{1}{2}AI_2], [\tfrac{1}{2}AQ_2 + \tfrac{1}{2}AI_1] + [\tfrac{1}{2}AI_1 - \tfrac{1}{2}AQ_2]) = (-AQ_1, AI_1) \qquad (16)$$

at a second output of post-amplifier hybrid combiner 697. (−AQ$_1$,AI$_1$) is a phase-shifted amplified version of the first diversity-encoded signal. This signal is then transmitted to the mobile terminal via antenna 645.

Transmitter 830 operates similarly when it is communicating with a mobile terminal that is not diversity-capable except the signal that is to be transmitted to the mobile terminal, referred to herein as the second signal, is encoded by channel processing circuitry 647 using the first encoding sequence and then modulated onto an RF signal by just one of the two radios, for example radio 850. Second signal (after it is encoded) is used as S$_1$, and S$_2$ is set to zero. Both S$_1$ and S$_2$ are provided to both digital pre-amplifier hybrid combiners 890 and 895.

With S$_2$=0, first composite signal becomes $$\left(\frac{1}{\sqrt{2}}I_1, \frac{1}{\sqrt{2}}Q_1\right),$$

and second composite signal becomes $$\left(-\frac{1}{\sqrt{2}}Q_1, +\frac{1}{\sqrt{2}}I_1\right).$$

Thus, first and second composite signals are a function of the second signal. RF section 860 of radio 850 then modulates the first composite signal onto an RF signal, and RF section 865 of radio 855 then modulates the second composite signal onto an RF signal.

The resulting first composite signal is amplified in power amplifier 670 and the resulting second composite signal is amplified in power amplifier 675. Therefore, in this case, only half of the second signal is amplified in each of the power amplifiers. This means that the power level of the signal going through each power amplifier is one-half of the power of the total signal. This allows the use of power amplifiers with half the power capacity, $\frac{1}{2}$P, of power amplifier 170 of transmitter 130 that does not use transmit diversity.

With S$_2$=0, there is no signal at the first output of post-amplifier hybrid combiner 697, and (−AQ$_3$, AI$_3$) is produced at the second output of post-amplifier hybrid combiner 697. (−AQ$_3$, AI$_3$) is an amplified (encoded and phase shifted) second signal. Thus, the amplified second signal is formed as a function the amplified composite signals. The amplified second signal is then transmitted to the mobile terminal via antenna 645 (and there is no signal transmitted over antenna 640).

To allow for the amplified first and second diversity encoded signals to be accurately obtained by the post-amplifier hybrid combiner, RF sections 860 and 865 of radios 850 and 855 should be phase and gain matched to produce acceptable antenna isolation tolerances. Where the antenna isolation tolerance is the ratio of the power of all of the signals that are not designed to be transmitted on an antenna over the power of the signal that is designed to be transmitted over the antenna. For example, the acceptable antenna isolation tolerance can be any antenna isolation tolerance equal to or less than 20 dB. To obtain an antenna isolation tolerance of 20 dB the phase of the RF sections 860 and 865 should be matched within 11.5°, and the gain matched within 1.6 dB.

Illustratively, the applicants propose that RF sections 860 and 865 can be designed to reduce the difficulties of phase and gain matching. For example, RF sections 860 and 865 (or possibly radios 850 and 855) can be implemented on the same circuit board using components of the same or similar type and size. Additionally, RF sections 860 and 865 can share the same clock. Applicants have realized that improvements in these and other factors of the design of radios 850 and 855, and particularly RF sections 860 and 865 may make it easier to phase and gain match the radios.

Amplifier Sharing Using 180° Hybrid Combiners.

Figure 9:
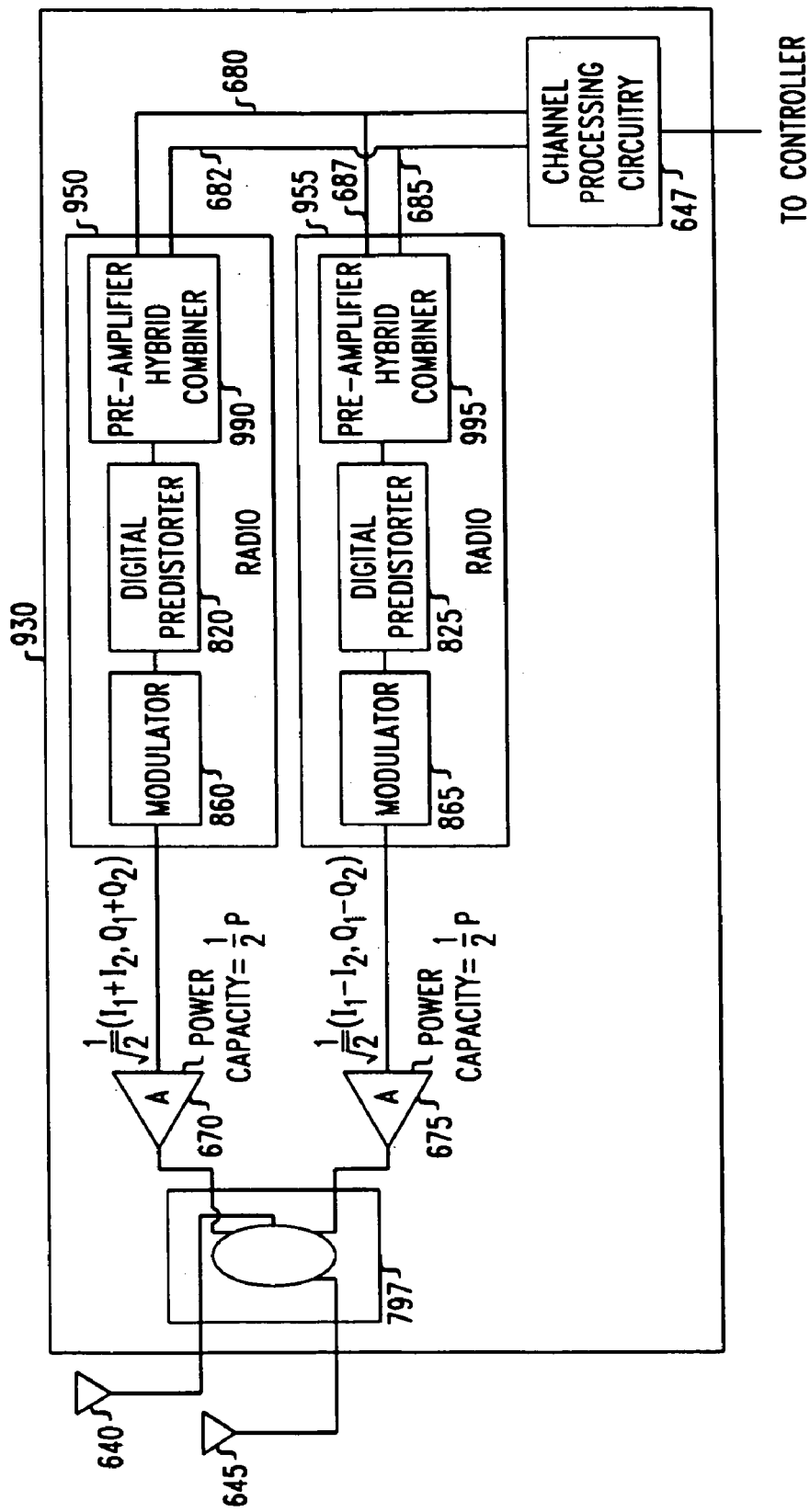
FIG. 9 shows two spaced apart antennas and a portion of a transmitter capable of sharing power amplifiers according to yet another embodiment of the present invention.

Similarly, to the analog pre-amplifier hybrid combiners, digital pre-amplifier hybrid combiners can be any type of digital hybrid combiners as long as an amplified first diversity-encoded signal is provided to one of two antennas and an amplified second diversity-encoded signal is provided to the other of the two antennas. For example, digital pre-amplifier hybrid combiners can be 180° hybrid combiners, in which case the post-amplifier hybrid combiner would also be a 180° hybrid combiner. FIG. 9 shows the operation of transmitter 930 where pre-amplifier hybrid combiners 990 and 995 are 180° hybrid combiners. When transmitter 930 is communicating with a mobile terminal that is diversity capable, the first signal (i.e. the signal that is to be transmitted to the mobile terminal) is provided to the channel processing circuitry 647 that processes the first signal using a diversity code and encoding sequences as described above to produce first and second diversity-encoded signals. Radios 850 and 855 use the diversity-encoded signals as the signals $S_1$ and $S_2$, each of which is provided to first and second digital pre-amplifier hybrid combiners 990 and 995.

First pre-amplifier hybrid combiner 990 forms first representative signals of $S_1$ and of $S_2$, each representative signal representing the same information as its respective diversity-encoded signal ($S_1$ or $S_2$). Second pre-amplifier hybrid combiner 995 forms second representative signals of $S_1$ and of $S_2$, each representative signal representing the same information as its respective diversity-encoded signal ($S_1$ or $S_2$). The power of each representative signal will be ½ the power of the diversity-encoded signals, making the voltage of each representative signal $$\frac{1}{\sqrt{2}}$$

of the voltage of the diversity-encoded signals. Therefore, first pre-amplifier hybrid combiner 990 forms representative signals $$\left(\frac{1}{\sqrt{2}}I_1, \frac{1}{\sqrt{2}}Q_1\right)$$

from $S_1$ and $$\left(\frac{1}{\sqrt{2}}I_2, \frac{1}{\sqrt{2}}Q_2\right)$$

from $S_2$ and second pre-amplifier hybrid combiner 995 forms representative signals $$\left(\frac{1}{\sqrt{2}}I_1, \frac{1}{\sqrt{2}}Q_1\right)$$

from $S_1$ and $$\left(\frac{1}{\sqrt{2}}I_2, \frac{1}{\sqrt{2}}Q_2\right)$$

from $S_2$. First pre-amplifier hybrid combiner 990 provides the first composite signal, which is the sum of one representative signal of $S_1$ and one representative signal of $S_2$:

$$\left(\frac{1}{\sqrt{2}}I_1 + \frac{1}{\sqrt{2}}I_2, \frac{1}{\sqrt{2}}Q_1 + \frac{1}{\sqrt{2}}Q_2\right). \tag{17}$$

Thus, the first composite signal is a function of a sum of the first diversity-encoded signal and of the second diversity-encoded signal.

Second pre-amplifier hybrid combiner 995 provides the second composite signal, which is the difference between one representative signal of $S_1$ and one representative signal of $S_2$:

$$\left(\frac{1}{\sqrt{2}}I_1 - \frac{1}{\sqrt{2}}I_2, \frac{1}{\sqrt{2}}Q_1 - \frac{1}{\sqrt{2}}Q_2\right). \tag{18}$$

Thus, the second composite signal is a function of a difference between the first diversity-encoded signal and the second diversity-encoded signal.

RF section 860 of radio 950 then modulates the first composite signal onto an RF signal and RF section 865 of radio 955 modulates the second composite signal onto an RF signal.

The modulated first composite signal is then amplified in power amplifier 670 and the modulated second composite signal is amplified in power amplifier 675. The power of each of the first and second composite signal is one half the power of $S_1$ plus one half the power of $S_2$. This is half of the sum of the power of the first and second diversity-encoded signals, which is half of the power of the first signal. Therefore, only half of the power of the first signal is amplified in each of the amplifiers.

Post-amplifier hybrid combiner 797 uses the two amplified composite signals to form two representative signals of equal power for each amplified composite signal. The power of the first composite signal is $(½A)^2$ the power of $S_1$ plus $(½A)^2$ the power of $S_2$, making the voltage of each representative signal of the first amplified composite signal to be ½A the voltage of $S_1$ plus ½A the voltage of $S_2$. The power of the second composite signal is also $(½A)^2$ the power of $S_1$ plus $(½A)^2$ the power of $S_2$, making the voltage of each representative signal of the amplified composite signal to be ½A the voltage of $S_1$ plus ½A the voltage of $S_2$.

Post-amplifier hybrid combiner 797 provides the sum of one representative signal of the amplified first composite signal and one representative signal of the amplified second composite signal, $$([½AI_1+½AI_2]+[½AI_1-½AI_2], [½AQ_1+½AQ_2]+[½AQ_1-½AQ_2])=(AI_1,AQ_1) \quad (19)$$

$(AI_1, AQ_1)$ is an amplified first diversity-encoded signal. This signal is then transmitted to the mobile terminal via antenna 640.

Post-amplifier hybrid combiner 797 also provides the difference between one representative signal of the amplified first composite signal and one representative signal of the amplified second composite signal, $$([½AI_1+½AI_2]-[½AI_1-½AI_2], [½AQ_1+½AQ_2]-[½AQ_1-½AQ_2])=(AI_2,AQ_2) \quad (20)$$

$(AI_2,AQ_2)$ is an amplified second diversity-encoded signal. This signal is then transmitted to the mobile terminal via antenna 645.

Transmitter 930 operates similarly when it is communicating with a mobile terminal that is not diversity-capable except the signal that is to be transmitted to the mobile terminal, referred to herein as the second signal, is encoded by channel processing circuitry 647 using the first encoding sequence, and then modulated onto an RF signal by just one of the two radios, for example radio 950. Second signal is used as $S_1$, and $S_2$ is set to zero. Both $S_1$ and $S_2$ are provided to digital pre-amplifier hybrid combiner 990 and to digital first combiner 995.

With $S_2=0$, first composite signal becomes $$\left(\frac{1}{\sqrt{2}}I_1, \frac{1}{\sqrt{2}}Q_1\right),$$

and second composite signal becomes $$\left(-\frac{1}{\sqrt{2}}Q_1, +\frac{1}{\sqrt{2}}I_1\right).$$

Thus, the first and second composite signals are a function of the second signal. RF section 860 of radio 950 then modulates the first composite signal onto an RF signal, and RF section 865 of radio 955 then modulates the second composite signal onto an RF signal.

The resulting first composite signal is amplified in power amplifier 670 and the resulting second composite signal is amplified in power amplifier 675. Therefore, in this case, only half of the second signal is amplified in each of the power amplifiers. This means that the power level of the signal going through each power amplifier is one-half of the power of the second signal. This allows the use of power amplifiers with half the power capacity, ½P, of power amplifier 170 of transmitter 130 that does not use transmit diversity.

With $S_2=0$, $(AI_1, AQ_1)$, is produced at a first output of post-amplifier hybrid combiner 797 and there is no signal at the second output of post-amplifier hybrid combiner 797. $(AI_1, AQ_1)$ is an amplified (encoded) second signal $S_1$. This signal is transmitted to the mobile terminal via antenna 640, and there is nothing to transmit at over antenna 645.

The transmitters according to the embodiments of the invention can form the composite signals either in the analog or in the digital domain as described above. Illustratively, forming the composite signals in the digital domain and using digital pre-distortion to pre-distort the composite signals prior to amplification provides the advantages described above. Forming the composite signals in the analog domain can be used to avoid having to phase and gain match the radios in applications where digital pre-distortion is not available, for example, if digital pre-distortion is not available when the signals that are to be transmitted have a bandwidth larger than 5 MHz. Then for applications where the bandwidth of the signals is larger than 5 MHz there may be some advantage in forming the composite signals in the analog domain. Although even in the embodiments where the digital pre-distortion is not used (such as the embodiments shown in FIGS. 6 and 7) the pre-amplifier hybrid combiner can be implemented in the digital domain. In these embodiments the pre-amplifier hybrid combiner would process the signals before they are processed by the radios, and the radios should be phase and gain matched. The transmitters 630, 730, 830, and 930 according to the embodiments of the invention can all be used in a base station, such as base station 112, that, as described above, also includes also includes at least one antenna and a receiver to receive signals from the mobile terminals. When the diversity technique used is spatial diversity, the base station would also include at least two antennas, where at least one of the antennas is coupled to the receiver, and at least two of the antennas are coupled to the transmitter.

The foregoing is merely illustrative. Thus, for example, in the illustrative embodiments each of the shared power amplifiers 670 and 675 is described as having a power capacity that is smaller than the power capacity of power amplifier 170 of the non-diversity system. In alternative embodiments of the invention, the shared power amplifiers 670 and 675 can have any power capacity, including a power capacity equal to or larger than the power capacity of power amplifier 170 of the non-diversity system. One of the advantages provided by the present invention is that an increase in the power capacity of the shared power amplifiers may produce an increase in the capacity of the system that is proportionally larger than the increase in the power capacity of the power amplifiers. For example, if the each shared power amplifier 670 and 675 has the same power capacity as the power amplifiers of a non-diversity system, then the capacity of the base station containing the shared power amplifiers may be more than twice of the non diversity-capable base station.

Furthermore, in the illustrative embodiments transmit diversity is realized with two diversity encoded signals. In alternative embodiments of the invention, transmit diversity can be realized with more than two diversity-encoded signals. In base stations where a plurality of diversity-encoded signals are used to realize transmit diversity, there would be a power amplifier for each of the diversity-encoded signals (and where spatial diversity is used, there would be an antenna for each of the diversity-encoded signals). The first signal would be replicated using the diversity coding and encoded using the encoding sequences to produce the diversity-encoded signals. Each of the diversity-encoded signals could be processed by one or more pre-amplifier hybrid combiners to produce a plurality of composite signals that are amplified by the power amplifier. The amplified composite signals can then be processed by the post-amplifier hybrid combiner to provide an amplified version of one of diversity-encoded signals on each of the antennas.

Additionally, in the illustrative embodiments of the invention, transmit diversity is implemented by transmitting a signal from a base station to a mobile terminal using transmit diversity. In alternative embodiments of the invention, a mobile terminal can use transmit diversity to transmit a signal to a base station in accordance with the present invention.

Moreover, in the illustrative embodiments the power capacity of the two power amplifiers is equal, and $S_1$ and $S_2$ are split into equal powered representative signals that form the composite signals. In alternative embodiments of the invention the power capacity of the two power amplifiers is not equal and the power of the representative signals is not equal. The ratio of the powers of the two representative signals should be the same as the ratio of the power capacity of the two power amplifiers. The ratio of the power of the representative signals of each of the amplified composite signals would also be equal to the ratio of the power capacity of the two power amplifiers.

Furthermore, in the illustrative embodiments the radios and channel processing circuitry are arranged in a particular configuration. In alternative embodiments of the invention, the radios and channel processing circuitry can be arranged in any configuration. In one example, the functionally of the each of radios 650 and 655 can be performed by multiple radios. In a second example, some of the functionality of the two radios can be combined. For example, in some of the illustrative embodiments each radio is shown with its own digital circuitry. Optionally the two radios can share digital circuitry, for example, one digital predistorter can be shared by the two radios to replace the first and second digital predistorters 820 and 825. Similarly, one pre-amplifier hybrid combiner can be shared by the two radios 850 and 855 to replace the pre-amplifier hybrid combiners 890 and 895, and one pre-amplifier hybrid combiner can be shared by the two radios 950 and 955 to replace the pre-amplifier hybrid combiners 990 and 995. In a third example, although the functionality performed in the digital domain is shown as being performed in separate circuitry, (such as the channel processing circuitry, the pre-amplifier hybrid combiners, and the digital predistorters) one element can be used to perform some, or all, of this functionality.

Additionally, in some illustrative embodiments (such as the embodiments shown in FIGS. 6 and 7) the radios and the pre-amplifier hybrid combiner are shown as distinct functional blocks that can be implemented separately or as separate functional elements on the same circuit board. In these embodiments the radios, the channel processing circuitry, and the pre-amplifier hybrid combiner form a first device. In other illustrative embodiments the pre-amplifier hybrid combiner can be part of the radio, therefore the first device is just the radio and the channel processing circuitry.

Furthermore, although in the illustrative embodiments all of the signals are to be transmitted at the same frequency. In alternative embodiments the signals can be transmitted on different frequencies. For example, the amplified diversity-encoded signals are to be transmitted on one frequency, and the amplified second signals are to be transmitted on another frequency; or some of the amplified diversity-encoded signals and amplified second signals are to be transmitted on one frequency, and other amplified diversity-encoded signals and amplified second signals are to be transmitted on another frequency.

Moreover, although in the illustrative embodiment the amplifier sharing with digital pre-distortion is shown in applications that support transmitting a signal using transmit diversity as well as transmitting a signal without using transmit diversity, in alternative embodiments amplifier sharing with digital pre-distortion can also be used in other applications, such as applications that share amplifiers between two so-called sectors of a cell of a wireless telecommunication system. Additionally, amplifier sharing with digital pre-distortion can be used in applications that support just transmitting a signal using transmit diversity, or in application that support just transmitting a signal without using transmit diversity.

Furthermore, in the illustrative embodiments, the invention is described as geared toward sharing power amplifiers. In alternative embodiments of the invention, the amplifiers that are shared can be any amplifiers. In which case the functionality of the radios to convert a digital signal to an analog RF signal may not be useful in the implementation of such embodiments of the invention.

Additionally, one skilled in the art will recognize that although in the illustrative embodiment each cell is an omni sector, the cell can be divided into a plurality of sectors. In this case the base station would have radios, hybrid combiners, at least two amplifiers, and antennas for each sector.

While the invention has been described with reference to a preferred embodiment, it will be understood by those skilled in the art having reference to the specification and drawings that various modifications and alternatives are possible therein without departing signaling from the spirit and scope of the invention.

We claim:

1. A method for amplifying at least a first diversity-encoded signal and second diversity-encoded signal, each of which represents information of a first signal to be transmitted using transmit diversity, and for amplifying a second signal to be transmitted without using transmit diversity, comprising the steps of:
    sharing the amplification of the at least first and second diversity-encoded signals between at least two amplifiers;
    sharing the amplification of the second signal between the at least two amplifiers; and
    forming each of at least first and second composite signals as a function of the second signal,
    wherein the second sharing step includes:
        amplifying the first composite signal; and
        amplifying the second composite signal.

2. The method of claim 1, wherein the first and second sharing steps are carried out concurrently.

3. The method of claim 1, further comprising the steps of:
    forming each of at least first and second composite signals as a function of the at least first and second diversity-encoded signals,
    wherein the first sharing step includes:
        amplifying the first composite signal in a first amplifier; and
        amplifying the second composite signal in a second amplifier.

4. The method of claim 3,
    wherein
        amplifying the first composite signal is in a first amplifier; and
        amplifying the second composite signal is in a second amplifier.

5. The method of claim 3, wherein the step of forming the at least first and second composite signals is performed in a digital domain.

6. The method of claim 5, further comprising the steps of:
    pre-distorting the first composite signal; and
    pre-distorting the second composite signal, wherein the steps of amplifying the first and second composite signals further include amplifying the pre-distorted first composite signal and the pre-distorted second composite signal.

7. A method for processing at least a first diversity-encoded signal and a second diversity-encoded signal, each of which represents information of a first signal to be transmitted using transmit diversity, and a second signal to be transmitted without using transmit diversity, comprising the steps of:
forming at least a first composite signal and a second composite signal as a function of the at least first and second diversity-encoded signals;
amplifying the first composite signal to produce an amplified first composite signal;
amplifying the second composite signal to produce an amplified second composite signal; and
forming amplified first and second diversity-encoded signals as functions of at least the amplified first and amplified second composite signals, in which
the amplification of the at least first and second diversity-encoded signals is shared between at least two amplifiers.

8. The method of claim 7, further comprising the steps of:
forming a phase-shifted first diversity-encoded signal and a phase-shifted second diversity-encoded signal, wherein
the amplified first diversity-encoded signal further includes an amplified phase-shifted first diversity-encoded signal; and
the amplified second diversity-encoded signal further includes an amplified phase-shifted second diversity-encoded signal.

9. The method of claim 7, further comprising the steps of:
forming a phase-shifted first diversity-encoded signal and a phase-shifted second diversity-encoded signal, wherein
the first composite signal is a function of a combination of the first diversity-encoded signal with the phase-shifted version of the second diversity-encoded signal, and
the second composite signal is a function of a combination of the second diversity-encoded signal with the phase-shifted version of the first diversity-encoded signal.

10. The method of claim 7, further comprising the steps of:
forming a phase-shifted first diversity-encoded signal and a phase-shifted second diversity-encoded signal, wherein
the amplified first diversity-encoded signal is a function of a combination of the amplified first composite signal with the phase-shifted version of the amplified second composite signal, and
the amplified second diversity-encoded signal is a function of a combination of the amplified second composite signal with the phase-shifted version of the amplified first composite signal.

11. The method of claim 7, wherein
the first composite signal is a function of a sum of the first diversity-encoded signal and the second diversity-encoded signal; and
the second composite signal is a function of a difference between the first diversity-encoded signal and the second diversity-encoded signal.

12. The method of claim 7, wherein
the amplified first diversity-encoded signal is a function of a sum of the amplified first composite signal and the amplified second composite signal; and
the amplified second diversity-encoded signal is a function of a difference between the amplified first composite signal and the amplified second composite signal.

13. The method of claim 7, further comprising the steps of:
transmitting the amplified first diversity-encoded signal over a first antenna; and
transmitting the amplified second diversity-encoded signal over a second antenna.

14. The method of claim 7, further comprising the steps of: forming the at least first and second composite signals as a function of a second signal; and
forming an amplified second signal as a function of at least the amplified first and second composite signals.

15. The method of claim 7, wherein the step of forming the at least first and second composite signals is performed in a digital domain.

16. The method of claim 15, further comprising the steps of:
pre-distorting the first composite signal; and
pre-distorting the second composite signal,
wherein the steps of amplifying the first and second composite signals further include amplifying the pre-distorted first and second composite signals.

17. A transmitter, comprising:
a first device for forming at least a first composite signal and a second composite signal as functions of at least first and second diversity-encoded signals, the first and second diversity-encoded signals representing information of a first signal to be transmitted using transmit diversity, and a second signal to be transmitted without using transmit diversity,
a first amplifier having an input coupled to the first device, the first amplifier amplifying the first composite signal to produce an amplified first composite signal;
a second amplifier having an input coupled to the first device, the second amplifier amplifying the second composite signal to produce an amplified second composite signal; and
a second device having a first input coupled to an output of the first amplifier and a second input coupled to an output of the second amplifier, the second device forms amplified first and second diversity-encoded signals as functions of at least the amplified first and second composite signals, in which the amplification of the at least first and second diversity-encoded signals is shared between the first and second amplifiers.

18. The transmitter of claim 17, wherein the first device includes:
channel processing circuitry; and
at least one radio for forming the first and second composite signals.

19. The transmitter of claim 17, wherein
the first device includes:
channel processing circuitry;
at least one radio; and
a first hybrid combiner having an input coupled to an output of the radio, a first output coupled to the first amplifier, and a second output coupled to the second amplifier, the first hybrid combiner forming the first and second composite signals; and the second device includes a second hybrid combiner having a first input coupled to the first amplifier and a second input coupled to the second amplifier.

20. The transmitter of claim 19, wherein the first and second hybrid combiners are embodied as 90° hybrid combiners.

21. The transmitter of claim 17, wherein
the first device further includes a digital predistorter having an output coupled to the first and second amplifiers, the digital predistorter pre-distorts the first composite signal and the second composite signal,
the first amplifier amplifies the pre-distorted first composite signal to produce the amplified first composite signal, and
the second amplifier amplifies the pre-distorted second composite signal to produce the amplified second composite signal.

22. The transmitter of claim 17, further comprising the steps of:
forming a phase-shifted first diversity-encoded signal and a phase-shifted second diversity-encoded signal, wherein
the amplified first diversity-encoded signal further includes an amplified phase-shifted first diversity-encoded signal, and
the amplified second diversity-encoded signal further includes an amplified phase-shifted second diversity-encoded signal.

23. An apparatus, comprising:
at least one or more antenna; and
a transmitter coupled to at least one of the at least one or more antennas, the transmitter comprising:
a first device for forming at least a first composite signal and a second composite signal as functions of at least first and second diversity-encoded signals, the first and second diversity-encoded signals representing information of a first signal to be transmitted using transmit diversity, and a second signal to be transmitted without using transmit diversity;
a first amplifier having an input coupled to the first device, the first amplifier amplifying the first composite signal to produce an amplified first composite signal;
a second amplifier having an input coupled to the first device, the second amplifier amplifying the second composite signal to produce an amplified second composite signal; and
a second device having a first input coupled to an output of the first amplifier and having a second input coupled to an output of the second amplifier, the second device forms amplified first and second diversity-encoded signals as functions of at least the amplified first and second composite signals, in which the amplification of the at least first and second diversity-encoded signals is shared between the first and second amplifiers.

24. The apparatus of claim 23, wherein the first device includes:
channel processing circuitry; and
at least one radio for forming the first and second composite signals.

25. The apparatus of claim 23, wherein
the first device includes:
channel processing circuitry;
at least one radio; and
a first hybrid combiner having an input coupled to an output the radio, a first output coupled to the first amplifier, and a second output coupled to the second amplifier, the first hybrid combiner forming the first and second composite signals, wherein
the second device includes a second hybrid combiner having a first input coupled to the first amplifier, and a second input coupled to the second amplifier.

26. The apparatus of claim 25, wherein the first and second hybrid combiners are embodied as 90° hybrid combiners.

27. The apparatus of claim 23, wherein
the first device further includes a digital predistorter having an output coupled to the first and second amplifiers, the digital predistorter pre-distorts the first composite signal and the second composite signal;
the first amplifier amplifies the pre-distorted first composite signal to produce the amplified first composite signal; and
the second amplifier amplifies the pre-distorted second composite signal to produce the amplified second composite signal.

28. The apparatus of claim 23, wherein
the amplified first diversity-encoded signal further includes an amplified phase-shifted first diversity-encoded signal, and
the amplified second diversity-encoded signal further includes an amplified phase-shifted second diversity-encoded signal.

29. The apparatus of claim 23, wherein the apparatus includes at least two antennas and the transmitter is coupled to at least two of the antennas.

30. The apparatus of claim 23, further comprising a receiver coupled to at least one of the antennas.

31. A method for amplifying at least a first diversity-encoded signal and a second diversity-encoded signal, each representing information of a first signal to be transmitted using transmit diversity, and for amplifying a second signal to be transmitted without using transmit diversity, comprising:
sharing the amplification of the at least first and second diversity-encoded signals between at least two amplifiers, concurrently;
sharing the amplification of the second signal between the at least two amplifiers; and
forming each of at least first and second composite signals as a function of the second signal,
wherein the second sharing step includes:
amplifying the first composite signal; and
amplifying the second composite signal.

32. A method for processing at least a first diversity-encoded signal and a second diversity-encoded signal, each representing information of a first signal to be transmitted using transmit diversity, and a second signal to be transmitted without using transmit diversity, comprising:
forming a phase-shifted first diversity-encoded signal and a phase-shifted second diversity-encoded signal;
forming at least a first composite signal based on a combination of the first diversity-encoded signal with the phase-shifted version of the second diversity-encoded signal;
forming a second composite signal based on a combination of the second diversity-encoded signal with the phase-shifted version of the first diversity-encoded signal;
amplifying the first composite signal to produce an amplified first composite signal;
amplifying the second composite signal to produce an amplified second composite signal; and forming amplified first and second diversity-encoded signals based on the amplified first and second composite signals, in which the amplification of the at least first and second diversity-encoded signals is shared between at least two amplifiers.

33. A transmitter, comprising:

at least one radio;

a first hybrid combiner coupled to the radio, the first hybrid combiner forming at least first and second composite signals based on at least first and second diversity-encoded signals, the first and second diversity-encoded signals representing information of a first signal to be transmitted using transmit diversity, and a second signal to be transmitted without using transmit diversity;

a first amplifier coupled to the first hybrid combiner, the first amplifier amplifying the first composite signal to produce an amplified first composite signal;

a second amplifier coupled to the first hybrid combiner, the second amplifier amplifying the second composite signal to produce an amplified second composite signal; and a second hybrid combiner coupled to the first amplifier and to the second amplifier for forming amplified first and second diversity-encoded signals based on the amplified first and second composite signals, in which the amplification of the at least first and second diversity-encoded signals is shared between the first and second amplifiers.

34. An apparatus, comprising:

at least one or more antennas; and a transmitter coupled to at least one of the at least one or more antennas, the transmitter comprising:

at least one radio;

a first hybrid combiner coupled to the radio, the first hybrid combiner forming at least first and second composite signals based on at least first and second diversity-encoded signals, the first and second diversity-encoded signals representing information of a first signal to be transmitted using transmit diversity, and a second signal to be transmitted without using transmit diversity;

a first amplifier coupled to the first hybrid combiner, the first amplifier amplifying the first composite signal to produce an amplified first composite signal;

a second amplifier coupled to the first hybrid combiner, the second amplifier amplifying the second composite signal to produce an amplified second composite signal; and a second hybrid combiner coupled to the first amplifier and to the second amplifier for forming amplified first and second diversity-encoded signals based on the amplified first and second composite signals, in which the amplification of the at least first and second diversity-encoded signals is shared between the first and second amplifiers.

* * * * *